(12) United States Patent
Choudhary et al.

(10) Patent No.: US 12,353,305 B2
(45) Date of Patent: Jul. 8, 2025

(54) COMPLIANCE AND DEBUG TESTING OF A DIE-TO-DIE INTERCONNECT

(71) Applicant: Intel Corporation, Santa Clara, CA (US)

(72) Inventors: Swadesh Choudhary, Mountain View, CA (US); Narasimha Lanka, Dublin, CA (US); Debendra Das Sharma, Saratoga, CA (US); Lakshmipriya Seshan, Sunnyvale, CA (US); Zuoguo Wu, San Jose, CA (US); Gerald Pasdast, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 308 days.

(21) Appl. No.: 17/844,348

(22) Filed: Jun. 20, 2022

(65) Prior Publication Data
US 2022/0318111 A1 Oct. 6, 2022

Related U.S. Application Data

(60) Provisional application No. 63/295,110, filed on Dec. 30, 2021.

(51) Int. Cl.
*G06F 11/00* (2006.01)
*G06F 11/263* (2006.01)
*G06F 13/42* (2006.01)

(52) U.S. Cl.
CPC ........ *G06F 11/263* (2013.01); *G06F 13/4221* (2013.01); *G06F 2213/0026* (2013.01)

(58) Field of Classification Search
CPC .............. G06F 11/263; G06F 13/4221; G06F 2213/0026
See application file for complete search history.

(56) References Cited

U.S. PATENT DOCUMENTS 7,936,779 B2   5/2011   Risberg et al.
8,782,321 B2   7/2014   Harriman et al.
(Continued)

FOREIGN PATENT DOCUMENTS

CN   105765544   4/2019
EP   2390969     11/2011
(Continued)

OTHER PUBLICATIONS

International Searching Authority, International Search Report and Written Opinion dated Mar. 13, 2023 in International Application No. PCT/US2022/049772 (12 pages).
(Continued)

*Primary Examiner* — Joshua P Lottich
(74) *Attorney, Agent, or Firm* — Eversheds Sutherland (US) LLP

(57) ABSTRACT

In one embodiment, an apparatus comprises a first die that includes: a die-to-die adapter comprising a plurality of first registers, the die-to-die adapter to communicate with protocol layer circuitry via a flit-aware die-to-die interface (FDI) and physical layer circuitry via a raw die-to-die interface (RDI), wherein the die-to-die adapter is to receive message information of a first interconnect protocol; and the physical layer circuitry coupled to the die-to-die adapter, the physical layer circuity comprising a plurality of second registers, where the physical layer circuitry is to receive and output the message information to a second die via an interconnect having a mainband and a sideband. During a test of the apparatus, the sideband is to enable access to information in at least one of the plurality of first registers or at least one of the plurality of second registers. Other embodiments are described and claimed.

20 Claims, 16 Drawing Sheets

(56) References Cited

U.S. PATENT DOCUMENTS

| | | | |
|---|---|---|---|
| 8,856,420 B2 | 10/2014 | Chandra et al. | |
| 8,953,644 B2 | 2/2015 | Chandra et al. | |
| 9,164,535 B2 | 10/2015 | Chandra et al. | |
| 9,772,970 B2 | 9/2017 | Luo et al. | |
| 9,785,556 B2 | 10/2017 | Sundararaman et al. | |
| 9,804,989 B2 | 10/2017 | Klein | |
| 10,496,593 B1* | 12/2019 | Miller | G06F 15/16 |
| 10,606,785 B2 | 3/2020 | Das Sharma et al. | |
| 10,614,000 B2 | 4/2020 | Agarwal et al. | |
| 10,698,842 B1 | 6/2020 | Dastidar et al. | |
| 10,817,462 B1 | 10/2020 | Dastidar et al. | |
| 10,848,595 B2 | 11/2020 | Song et al. | |
| 11,030,126 B2 | 6/2021 | Koufaty et al. | |
| 11,036,650 B2 | 6/2021 | Agarwal | |
| 11,194,505 B2 | 12/2021 | Lee et al. | |
| 11,201,838 B2 | 12/2021 | Marolia et al. | |
| 11,232,058 B2 | 1/2022 | Jen et al. | |
| 2011/0179212 A1 | 7/2011 | Hartman | |
| 2013/0108146 A1* | 5/2013 | Li | H01L 22/20 382/144 |
| 2013/0262948 A1 | 10/2013 | Takehara | |
| 2014/0114928 A1 | 4/2014 | Beers | |
| 2014/0372663 A1 | 12/2014 | Chandra et al. | |
| 2015/0032917 A1 | 1/2015 | Nguyen | |
| 2015/0089110 A1 | 3/2015 | Harriman et al. | |
| 2015/0221076 A1* | 8/2015 | Gao | G06T 7/001 382/149 |
| 2015/0324268 A1* | 11/2015 | Du | G06F 11/0745 714/43 |
| 2016/0061749 A1* | 3/2016 | Chen | G01N 21/9501 356/237.5 |
| 2017/0117250 A1* | 4/2017 | Xie | H01L 25/0655 |
| 2018/0025789 A1 | 1/2018 | Dono et al. | |
| 2018/0095920 A1* | 4/2018 | Kwak | G06F 11/2005 |
| 2018/0109446 A1 | 4/2018 | Srinivasan et al. | |
| 2018/0300275 A1 | 10/2018 | Wu et al. | |
| 2018/0348291 A1* | 12/2018 | Teplinsky | H01L 22/00 |
| 2019/0004990 A1 | 1/2019 | Van Doren et al. | |
| 2019/0095215 A1 | 3/2019 | Teoh et al. | |
| 2020/0042471 A1 | 2/2020 | Kerr et al. | |
| 2020/0044895 A1 | 2/2020 | Mittal et al. | |
| 2020/0194412 A1* | 6/2020 | Brewer | G11C 29/52 |
| 2020/0278733 A1 | 9/2020 | Li et al. | |
| 2020/0356436 A1 | 11/2020 | Iyer et al. | |
| 2020/0394148 A1 | 12/2020 | Regan et al. | |
| 2020/0394150 A1 | 12/2020 | Lanka et al. | |
| 2021/0089418 A1* | 3/2021 | Das Sharma | H04L 1/24 |
| 2021/0097015 A1 | 4/2021 | Das Sharma et al. | |
| 2021/0224156 A1 | 7/2021 | Cho et al. | |
| 2021/0399982 A1 | 12/2021 | Das Sharma et al. | |
| 2022/0222198 A1 | 7/2022 | Lanka et al. | |
| 2022/0237138 A1 | 7/2022 | Anka et al. | |
| 2022/0318111 A1 | 10/2022 | Choudhary et al. | |
| 2022/0327083 A1 | 10/2022 | Das Sharma et al. | |
| 2022/0327276 A1 | 10/2022 | Seshan et al. | |
| 2022/0342841 A1* | 10/2022 | Choudhary | G06F 13/4221 |
| 2022/0374305 A1* | 11/2022 | Yeap | G06F 11/108 |

FOREIGN PATENT DOCUMENTS

| | | |
|---|---|---|
| EP | 3037972 | 6/2016 |
| WO | 2015099719 | 7/2015 |
| WO | 2019009970 | 1/2019 |

OTHER PUBLICATIONS

International Searching Authority, International Search Report and Written Opinion dated Apr. 4, 2023 in International Application No. PCT/US2022/050653 (13 pages).

International Searching Authority, International Search Report and Written Opinion dated Apr. 5, 2023 in International Application No. PCT/US2022/050656 (13 pages).

International Searching Authority, International Search Report and Written Opinion dated Apr. 7, 2023 in International Application No. PCT/US2022/050657 (11 pages).

International Searching Authority, International Search Report and Written Opinion dated Apr. 14, 2023 in International Application No. PCT/US2022/050655 (11 pages).

Dr. Debendra Das Sharma, Universal Chiplet Interconnect Express (UCIe)®: Building an open chiplet ecosystem, Property of Universal Chiplet Interconnect Express (UCIe) 2022, 7 pgs.

Universal Chiplet Interconnect Express (UCIe), Universal Chiplet Interconnect Express (UCIe) Specification Revision 1.0, Feb. 24, 2022, 288 pgs.

U.S. Appl. No. 17/844,356, filed Jun. 20, 2022 entitled "Lane Repair and Lane Reversal Implementation for Die-To-Die (D2D) Interconnects," by Lakshmipriya Seshan, et al., 51 pgs.

U.S. Appl. No. 17/708,367, filed Mar. 30, 2022, entitled "Sideband Interface for Die-To-Die Interconnects," by Narasimha Lanka, et al., 49 pgs.

U.S. Appl. No. 17/708,386, filed Mar. 30, 2022, entitled "Link Initialization Training and Bring up for Die-to-Die Interconnect," by Narasimha Lanka, et al., 46 pgs.

U.S. Appl. No. 17/844,366, filed Jun. 20, 2022, entitled "Standard Interfaces for Die to Die (D2D) Interconnect Stacks," by Swadesh Choudhary, et al., 44 pgs.

* cited by examiner

COMPLIANCE AND DEBUG TESTING OF A DIE-TO-DIE INTERCONNECT

CROSS-REFERENCE TO RELATED APPLICATION

This application claims the benefit of U.S. Provisional Application No. 63/295,110, filed on Dec. 30, 2021, in the name of Swadesh Choudhary, Narasimha Lanka, Debendra Das Sharma, Lakshmipriya Seshan, Zuoguo Wu, Gerald Pasdast, entitled "COMPLIANCE AND DEBUG METHODS FOR DIE-TO-DIE (D2D) INTERCONNECTS."

BACKGROUND

Advancement in multi-chip packaging (MCP) may enable performance growth and creation of complex products. An MCP may be specified to operate at a very low bit error rate (BER) to meet stringent system failure in time (FIT) requirements. MCP implementations may also make die disaggregation possible by allowing multiple separate dies to operate like a single die. When a system that includes multiple devices that are packaged together, and the system fails or does not meet performance targets, it may be desired to understand the reason for such failure. The fault may be in a single device or multiple devices, and within each device the faults may be anywhere in electrical, logical, or protocol layers. Current techniques for debug do not scale well to die-to-die interconnects.

DETAILED DESCRIPTION

Figure 1:
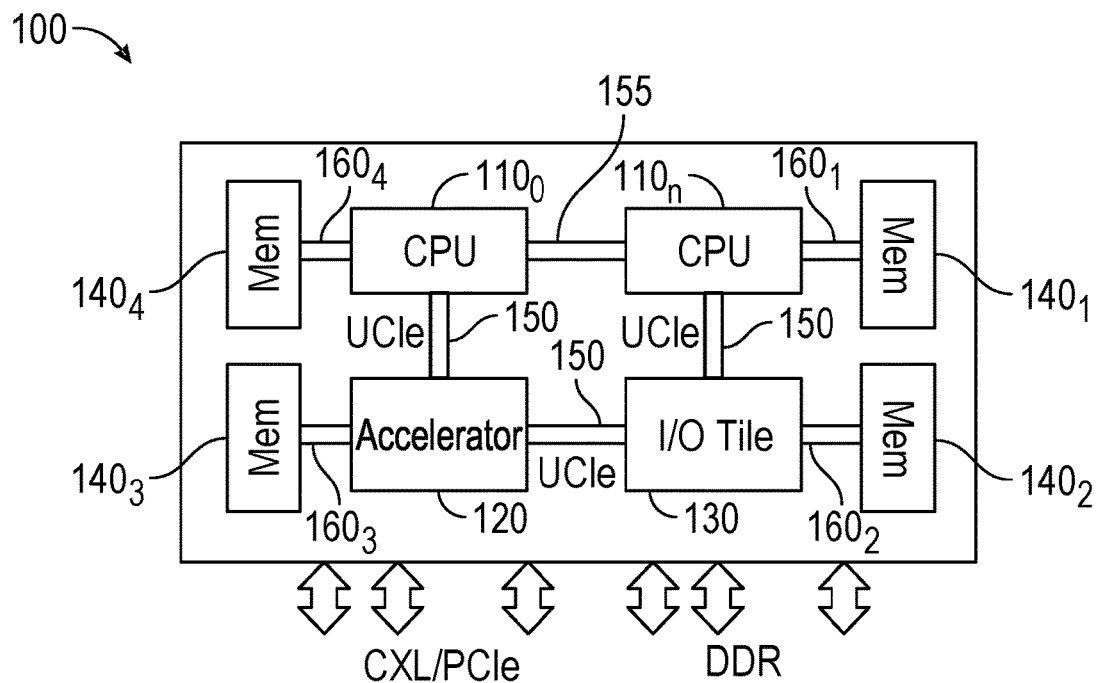
FIG. 1 is a block diagram of a package in accordance with an embodiment.

In various embodiments, a multi-protocol capable, on-package interconnect may be used to communicate between disaggregated dies of a package. This interconnect can be initialized and trained by an ordered bring up flow to enable independent reset of the different dies, detection of partner dies' reset exit, and an ordered initialization and training of sideband and mainband interfaces of the interconnect (in that order). More specifically, a sideband initialization may be performed to detect that a link partner die has exited reset and to initialize and train the sideband. Thereafter the mainband may be initialized and trained, which may include any lane reversal and/or repair operations as described further herein. Such mainband operations may leverage the already brought up sideband to communicate synchronization and status information.

With embodiments that perform lane reversal and/or repair, yield loss due to lane connectivity issues for advanced package multi-chip packages (MCPs) can be recovered. Further, by way of lane repair techniques in accordance with an embodiment, both left and right shift techniques may cover an entire bump map for efficient lane repair. Still further lane reversal detection may enable die rotation and die mirroring to enable multiple on-package instantiations with the same die. In this way, lane reversal may eliminate multiple tape-ins of the same die.

Embodiments may be implemented in connection with a multi-protocol capable, on-package interconnect protocol that may be used to connect multiple chiplets or dies on a single package. With this interconnect protocol, a vibrant ecosystem of disaggregated die architectures can be interconnected together. This on-package interconnect protocol may be referred to as a "Universal Chiplet Interconnect express" (UCIe) interconnect protocol, which may be in accordance with a UCIe specification as may be issued by a special interest group (SIG) or other promotor, or other entity. While termed herein as "UCIe," understand that the multi-protocol capable, on-package interconnect protocol may adopt another nomenclature.

This UCIe interconnect protocol may support multiple underlying interconnect protocols, including flit-based modes of certain communication protocols. In one or more embodiments, the UCIe interconnect protocol may support: a flit mode of a Compute Express Limited (CXL) protocol such as in accordance with a given version of a CXL specification such as the CXL Specification version 2.0 (published November 2020), any future update, version or variation thereof; a Peripheral Component Interconnect express (PCIe) flit mode such as in accordance with a given version of a PCIe specification such as the PCIe Base Specification version 6.0 (published 2022) or any future update, version or variation thereof; and a raw (or streaming) mode that be used to map any protocol supported by link partners. Note that in one or more embodiments, the UCIe interconnect protocol may not be backwards-compatible, and instead may accommodate current and future versions of the above-described protocols or other protocols that support flit modes of communication.

Embodiments may be used to provide compute, memory, storage, and connectivity across an entire compute continuum, spanning cloud, edge, enterprise, 5G, automotive, high-performance computing, and hand-held segments. Embodiments may be used to package or otherwise couple dies from different sources, including different fabs, different designs, and different packaging technologies.

Chiplet integration on package also enables a customer to make different trade-offs for different market segments by choosing different numbers and types of dies. For example, one can choose different numbers of compute, memory, and I/O dies depending on segment. As such, there is no need for a different die design for different segments, resulting in lower product stock keeping unit (SKU) costs.

Referring now to FIG. 1, shown is a block diagram of a package in accordance with an embodiment. As shown in FIG. 1, package 100 may be any type of integrated circuit package. In the particular illustration shown, package 100 includes multiple chiplets or dies, including central processing unit (CPU) dies $110_{0-n}$, an accelerator die 120, an input/output (I/O) tile 130, and memory $140_{1-4}$. At least certain of these dies may be coupled together via on-package interconnects in accordance with an embodiment. As shown, interconnects $150_{1-3}$ may be implemented as UCIe interconnects. CPUs 110 may couple via another on-package interconnect 155 which, in some cases, may provide CPU-to-CPU connectivity on-package using a UCIe interconnect that runs a coherency protocol. As one such example, this coherency protocol may be an Intel® Ultra Path Interconnect (UPI); of course other examples are possible.

While the protocols mapped to the UCIe protocol discussed herein include PCIe and CXL, understand embodiments are not limited in this regard. In example embodiments, mappings for any underlying protocols may be done using a flit format, including the raw mode. In an implementation, these protocol mappings may enable more on-package integration by replacing certain physical layer circuitry (e.g., a PCIe SERDES PHY and PCIe/CXL LogPHY along with link level retry) with a UCIe die-to-die adapter and PHY in accordance with an embodiment to improve power and performance characteristics. In addition, the raw mode may be protocol-agnostic to enable other protocols to be mapped, while allowing usages such as integrating a stand-alone SERDES/transceiver tile (e.g., ethernet) on-package. As further shown in FIG. 1, off-package interconnects may be in accordance with various protocols, including CXL/PCIe protocols, double data rate (DDR) memory interconnect protocols and so forth.

In an example implementation, accelerator 120 and/or I/O tile 130 can be connected to CPU(s) 110 using CXL transactions running on UCIe interconnects 150, leveraging the I/O, coherency, and memory protocols of CXL. In the embodiment of FIG. 1, I/O tile 130 can provide an interface to external CXL, PCIe and DDR pins of the package. Statically or dynamically, accelerator 120 can also be connected to CPUs 110 using PCIe transactions running on UCIe interconnects 150.

Packages in accordance with an embodiment may be implemented in many different types of computing devices, ranging from small portable devices such as smartphones and so forth, up to larger devices including client computing devices and server or other datacenter computing devices. In this way, UCIe interconnects may enable local connectivity and long-reach connectivity at rack/pod levels. Although not shown in FIG. 1, understand that at least one UCIe retimer may be used to extend the UCIe connectivity beyond the package using an off-package interconnect. Examples of off-package interconnects include electrical cables, optical cables or any other technology to connect packages at a rack/pod level.

Embodiments may further be used to support a rack/pod-level disaggregation using a CXL 2.0 (or later) protocol. In such arrangement, multiple compute nodes (e.g., a virtual hierarchy) from different compute chassis couple to a CXL switch that can couple to multiple CXL accelerators/Type-3 memory devices, which can be placed in one or more separate drawers. Each compute drawer may couple to the switch using an off-package Interconnect running a CXL protocol through a UCIe retimer.

Figure 2A:
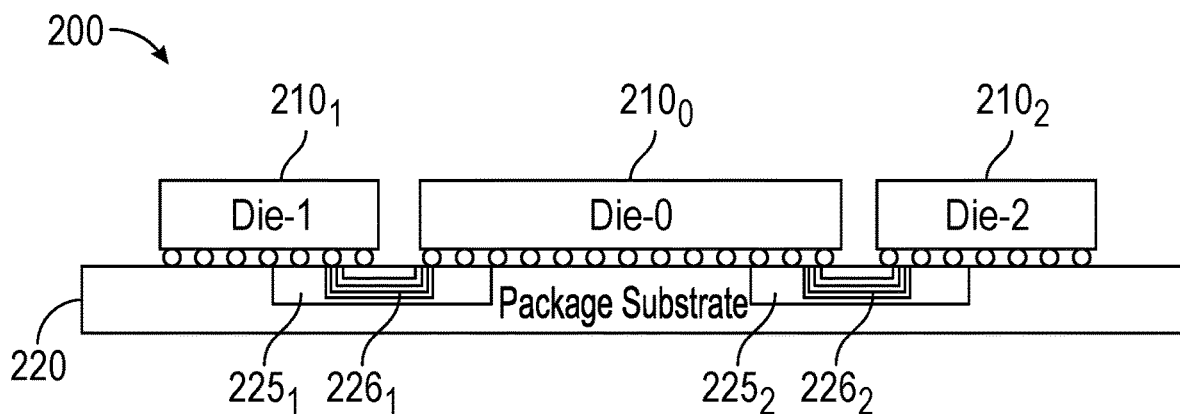
FIGS. 2A-2D are cross-sectional views of different packaging options incorporating embodiments.

Referring now to FIGS. 2A-2D, shown are cross-sectional views of different packaging options incorporating embodiments. As illustrated in FIG. 2A, package 200 may be an advanced package that provides advanced packaging technology. In one or more embodiments, an advanced package implementation may be used for performance optimized applications, including power-efficient performance applications. In some such example use cases, a channel reach may be short (e.g., less than 2 mm) and the interconnect can be optimized for high bandwidth and low latency with best performance and power efficiency characteristics.

As illustrated in FIG. 2A, package 200 includes a plurality of die 2100-2. Understand while three specific die are shown in FIG. 2A, many more die may be present in other implementations. Die 210 are adapted on a package substrate 220. In one or more embodiments, die 210 may be adapted to substrate 220 via bumps. As illustrated, package substrate 220 includes a plurality of silicon bridges 2251-2 that include on-package interconnects 2261-2. Interconnects 226 may be implemented as UCIe interconnects, and silicon bridges 225 may be implemented as Intel® EMIB bridges, in an embodiment.

Figure 2B:
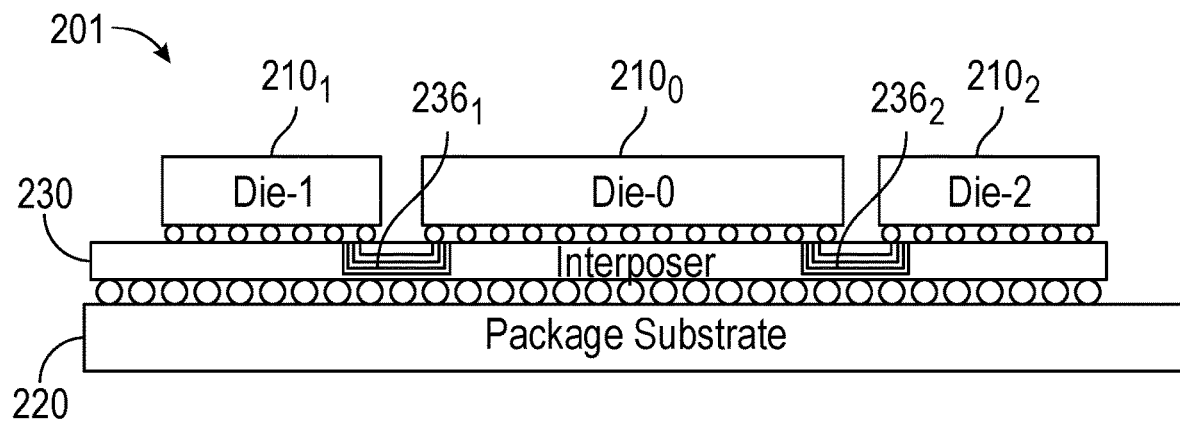

Referring now to FIG. 2B, shown is another embodiment of an advanced package, in which a package configuration is implemented as a Chip on Wafer on Substrate (CoWoS). In this illustration, package 201 includes die 210 that are adapted on an interposer 230, where this interposer includes corresponding on-package interconnects 236. In turn, interposer 230 adapts to package substrate 220 via bumps.

Figure 2C:
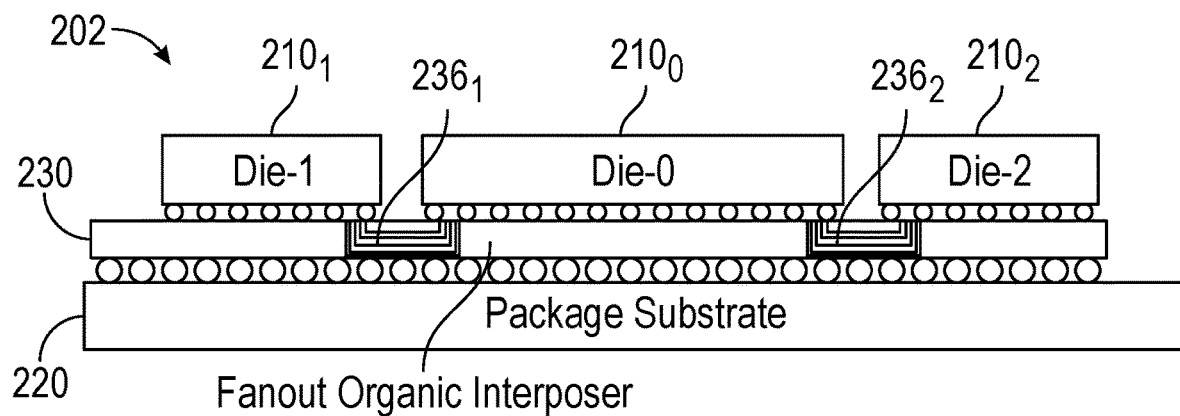

Referring now to FIG. 2C, shown is another embodiment of an advanced package, in which a package configuration is implemented with a fanout organic interposer 230. In this illustration, package 202 includes die 210 that are adapted on interposer 230 including corresponding on-package interconnects 236. In turn, interposer 230 adapts to package substrate 220 via bumps.

Figure 2D:
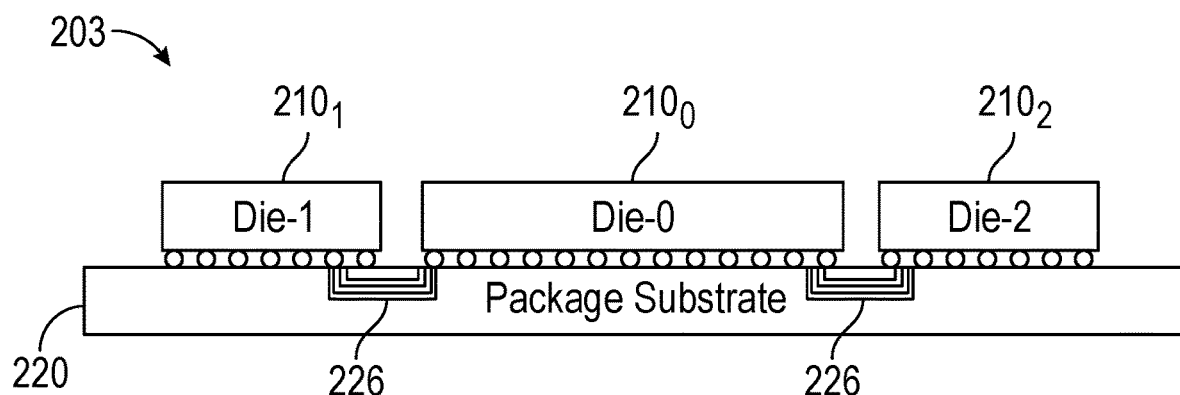

Referring now to FIG. 2D, shown is another package illustration. Package 203 may be a standard package that provides standard packaging technology. In one or more embodiments, a standard package implementations may be used for low cost and long reach (e.g., 10 mm to 25 mm) interconnects using traces on organic package/substrate, while still providing significantly better BER characteristics compared to an off-package SERDES. In this implementation, package 203 includes die 210 adapted to package substrate 220 where on-package interconnects 226 are adapted within package substrate 220 directly, without inclusion of silicon bridges or so forth.

Figure 3A:
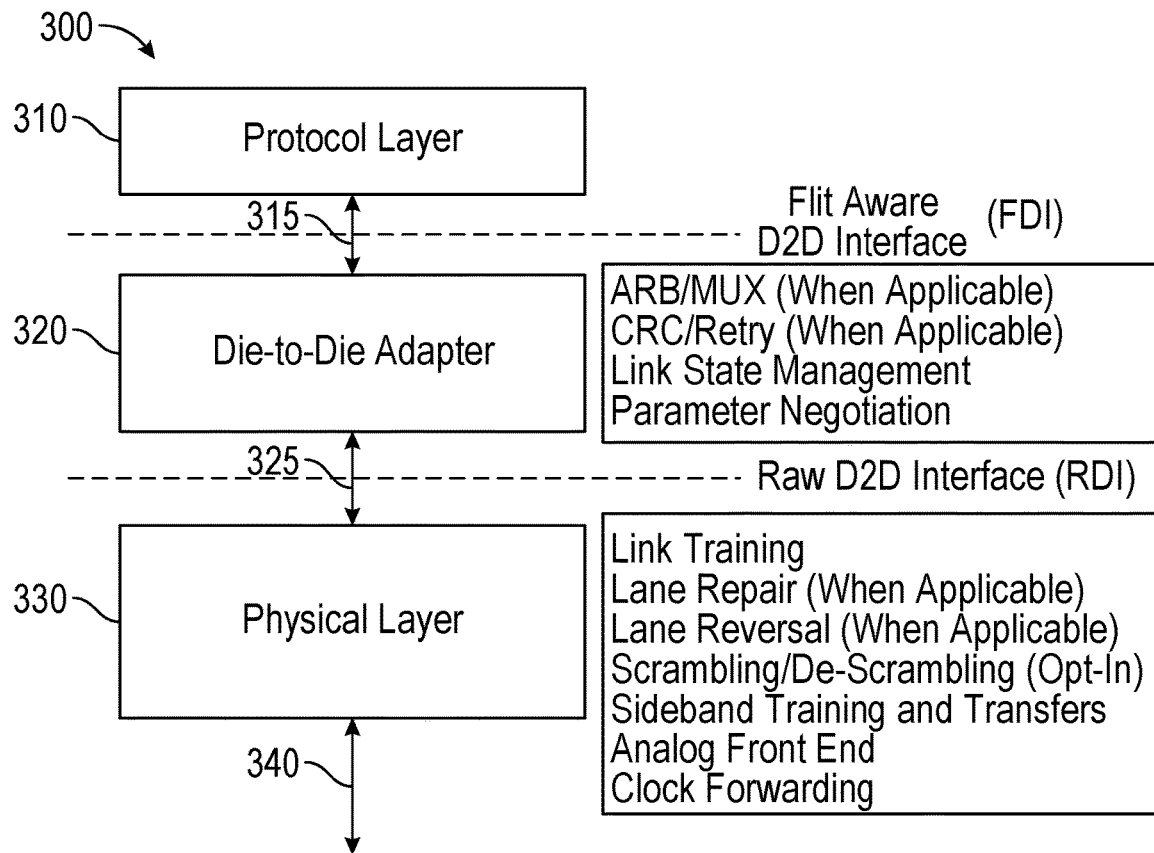
FIGS. 3A/3B is a block diagram of a layered protocol that may implement one or more embodiments.

Referring now to FIGS. 3A/3B, shown is a block diagram of a layered protocol that may implement one or more embodiments. As illustrated in the high level of FIG. 3A, multiple layers of a layered protocol implemented in a circuit 300 may implement an interconnect protocol. A protocol layer 310 may communicate information of one or more application-specific protocols. Protocol layer 310 may operate, in one or more implementations, according to one or more of a PCIe or CXL flit mode, and/or a streaming protocol to offer generic modes for a user-defined protocol to be transmitted. For each protocol, different optimizations and associated flit transfers are available.

In turn, protocol layer 310 couples to a die-to-die adapter (D2D) adapter 320 via an interface 315. In an embodiment, interface 315 may be implemented as a flit-aware D2D interface (FDI). In an embodiment, D2D adapter 320 may be configured to coordinate with protocol layer 310 and a physical layer 330 to ensure successful data transfer across a UCIe link 340. Adapter 320 may be configured to minimize logic on the main data path as much as possible, giving a low latency, optimized data path for protocol flits.

FIG. 3A illustrates various functionality performed within D2D adapter 320. D2D adapter 320 may provide link state management and parameter negotiation for connected dies (also referred to as "chiplets"). Still further D2D adapter 320 may optionally guarantee reliable delivery of data through cyclic redundancy check (CRC) and link level retry mechanism, e.g., where a raw BER is less than 1e-27. When multiple protocols are supported, D2D adapter 320 may define the underlying arbitration mechanism. For example, when transporting communications of a CXL protocol, adapter 320 may provide arbitrator/multiplexer (ARB/MUX) functionality that supports communications of multiple simultaneous protocols. In one or more embodiments a flow control unit (flit) of a given size, e.g., 256 bytes, may define the underlying transfer mechanism when D2D adapter 320 is responsible for reliable transfer.

When operation is in a flit mode, die-to-die adapter 320 may insert and check CRC information. In contrast, when operation is in a raw mode, all information (e.g., bytes) of a flit are populated by protocol layer 310. If applicable, adapter 320 may also perform retry. Adapter 320 may further be configured to coordinate higher level link state machine management and bring up, protocol options related parameter exchanges with a remote link partner, and when supported, power management coordination with the remote link partner. Different underlying protocols may be used depending on usage model. For example, in an embodiment data transfer using direct memory access, software discovery, and/or error handling, etc. may be handled using PCIe/CXL.io; memory use cases may be handled through CXL.Mem; and caching requirements for applications such as accelerators can be handled using CXL.cache.

Figure 3B:
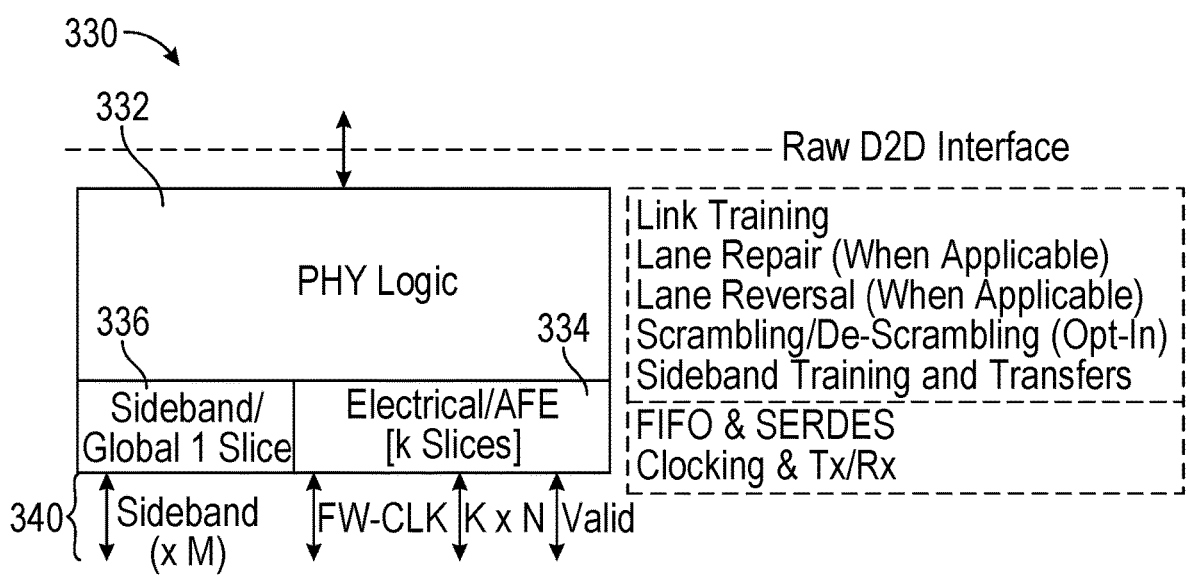

In turn, D2D adapter 320 couples to physical layer 330 via an interface 325. In an embodiment, interface 325 may be a raw D2D interface (RDI). As illustrated in FIG. 3B, physical layer 330 includes circuitry to interface with die-to-die interconnect 340 (which in an embodiment may be a UCIe interconnect or another multi-protocol capable on-package interconnect). In one or more embodiments, physical layer 330 may be responsible for the electrical signaling, clocking, link training, sideband, etc.

Interconnect 340 may include sideband and mainband links, which may be in the form of so-called "lanes," which are physical circuitry to carry signaling. In an embodiment, a lane may constitute circuitry to carry a pair of signals mapped to physical bumps or other conductive elements, one for transmission, and one for reception. In an embodiment, a xN UCIe link is composed of N lanes.

As illustrated in FIG. 3B, physical layer 330 includes three sub-components, namely a physical (PHY) logic 332, an electrical/analog front end (AFE) 334, and a sideband circuitry 336. In an embodiment, interconnect 340 includes a main band interface that provides a main data path on the physical bumps can be organized as a group of lanes called a Module or a Cluster.

The unit of construction of interconnect 340 is referred to herein equally as a "cluster" or "module." In an embodiment, a cluster may include N single-ended, unidirectional, full-duplex data lanes, one single-ended lane for Valid, one lane for tracking, a differential forwarded clock per direction, and 2 lanes per direction for sideband (single-ended clock and data). Thus a Module (or Cluster) forms the atomic granularity for the structural design implementation of AFE 334. There may be different numbers of lanes provided per Module for standard and advanced packages.

For example, for a standard package 16 lanes constitute a single Module, while for an advanced package 64 lanes constitute a single Module. Although embodiments are not limited in this regard, interconnect 340 is a physical interconnect that may be implemented using one or more of conductive traces, conductive pads, bumps and so forth that provides for interconnection between PHY circuitry present on link partner dies.

A given instance of protocol layer 310 or D2D adapter 320 can send data over multiple Modules where bandwidth scaling is implemented. The physical link of interconnect 340 between dies may include two separate connections: (1) a sideband connection; and (2) a main band connection. In embodiments, the sideband connection is used for parameter exchanges, register accesses for debug/compliance and coordination with remote partner for link training and management.

In one or more embodiments, a sideband interface is formed of at least one data lane and at least one clock lane in each direction. Stated another way, a sideband interface is a two-signal interface for transmit and receive directions. In an advanced package usage, redundancy may be provided with an additional data and clock pair in each direction for repair or increased bandwidth. The sideband interface may include a forwarded clock pin and a data pin in each direction. In one or more embodiments, a sideband clock signal may be generated by an auxiliary clock source configured to operate at 800 MHz regardless of main data path speed. Sideband circuitry 336 of physical layer 330 may be provided with auxiliary power and be included in an always on domain. In an embodiment, sideband data may be communicated at a 800 megatransfers per second (MT/s) single data rate signal (SDR). The sideband may be configured to run on a power supply and auxiliary clock source which are always on. Each Module has its own set of sideband pins.

The main band interface, which constitutes the main data path, may include a forwarded clock, a data valid pin, and N lanes of data per Module. For an advanced package option, N=64 (also referred to as x64) and overall four extra pins for lane repair are provided in a bump map. For a standard package option, N=16 (also referred to as x16) and no extra pins for repair are provided. Physical layer 330 may be configured to coordinate the different functions and their relative sequencing for proper link bring up and management (for example, sideband transfers, main-band training and repair etc.).

In one or more embodiments, advanced package implementations may support redundant lanes (also referred to herein as "spare" lanes) to handle faulty lanes (including clock, valid, sideband, etc.). In one or more embodiments, standard package implementations may support lane width degradation to handle failures. In some embodiments, multiple clusters can be aggregated to deliver more performance per link.

Figure 4A:
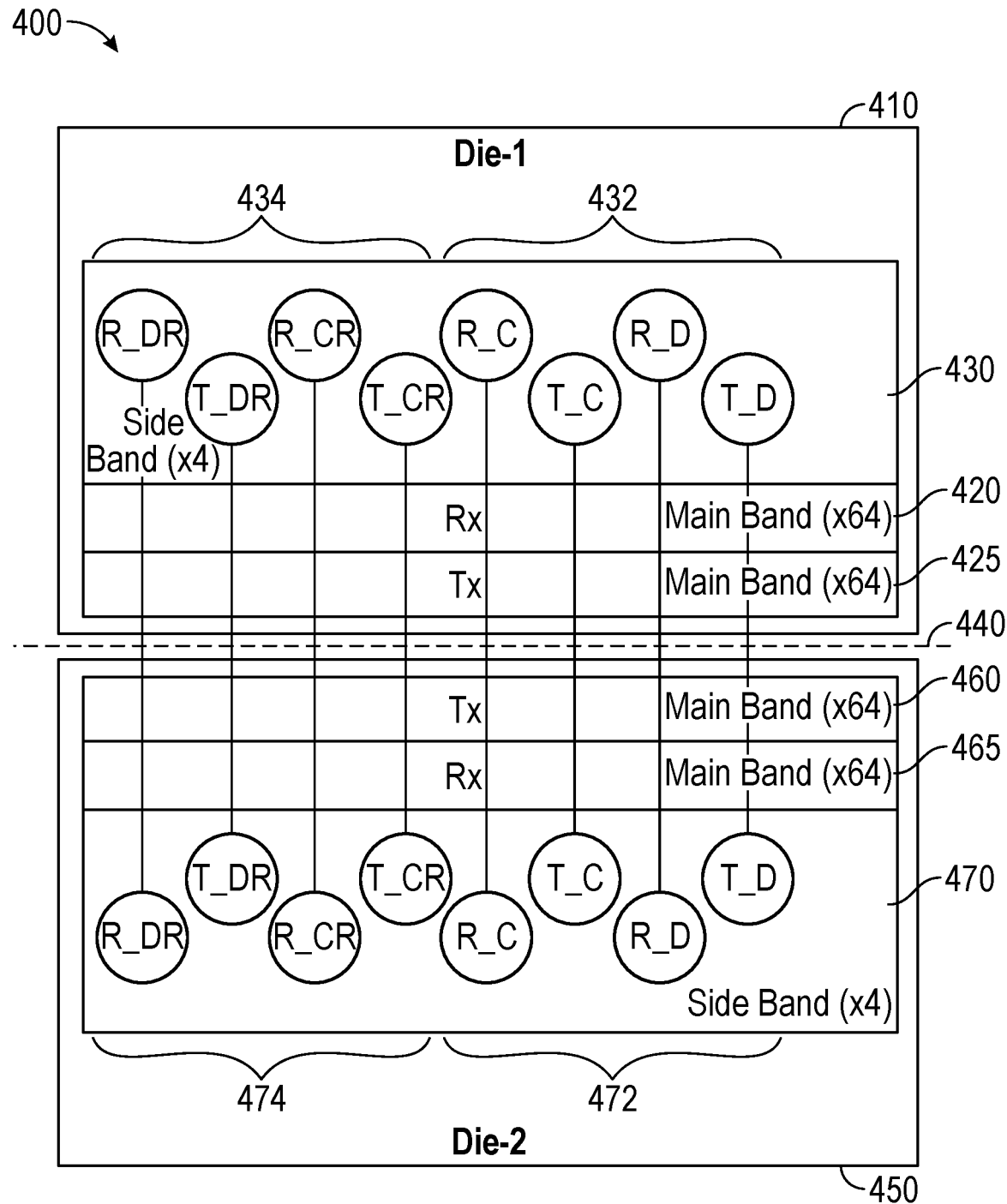
FIGS. 4A-4B are block diagrams of multi-die packages in accordance with various embodiments.

Referring now to FIG. 4A, shown is a block diagram of a multi-die package in accordance with an embodiment. As shown in FIG. 4A, package 400 includes at least a first die 410 and a second die 450. Understand that dies 410 and 450 may be various types of die including CPUs, accelerators, I/O devices or so forth. In the high level view shown in FIG. 4A, an interconnect 440 that couples the die together is illustrated as a dashed line. Interconnect 440 may be an instantiation of an on-package multi-protocol capable interconnect, e.g., a UCIe interconnect as described herein. While not shown in detail in FIG. 4A, understand that interconnect 440 may be implemented using conductive bumps adapted on each die, which may couple together to provide interconnection between the die. In addition, interconnect 440 further may include in-package circuitry such as conductive lines on or within one or more substrates. As used herein, understand that the term "lanes" refers to any and all interconnect circuitry that couples one die to another die.

In a particular embodiment, interconnect 440 may be a UCIe interconnect having one or more modules, where each module includes a sideband interface and a main band interface. In this high level view, the main band interface couples to main band receiver and transmitter circuitry within each die. Specifically, die 410 includes main band receiver circuitry 420 and main band transmitter circuitry 425, while in turn die 450 includes main band receiver circuitry 465 and main band transmitter circuitry 460.

FIG. 4A further shows connectivity for the sideband interface. In general, a sideband includes a data lane and a clock lane in each direction, and in an advanced package usage, redundancy may be provided with an additional data and clock pair in each direction. Thus FIG. 4A shows a first possible connectivity implementation between the sideband circuitry of the two die. Die 410 includes a sideband circuit 430 including first sideband circuitry 432 that includes corresponding sideband clock and data receivers (R_C and R_D) and sideband clock and data transmitters (T_C and T_D) that couple to corresponding sideband transmitter and receiver circuitry of a sideband circuitry 470 of second die 450, respectively. Sideband circuit 430 also includes second sideband circuitry 434 having similar circuitry for redundant sideband clock and data transmitters and receivers (enumerated as above, with an "R" terminating the transmitter and receiver abbreviations).

In FIG. 4A, a first sideband connectivity instantiation is illustrated, where sideband circuitry 432 and 472 act as a functional sideband, and sideband circuitry 434 and 474 acts as a redundant sideband.

Figure 4B:
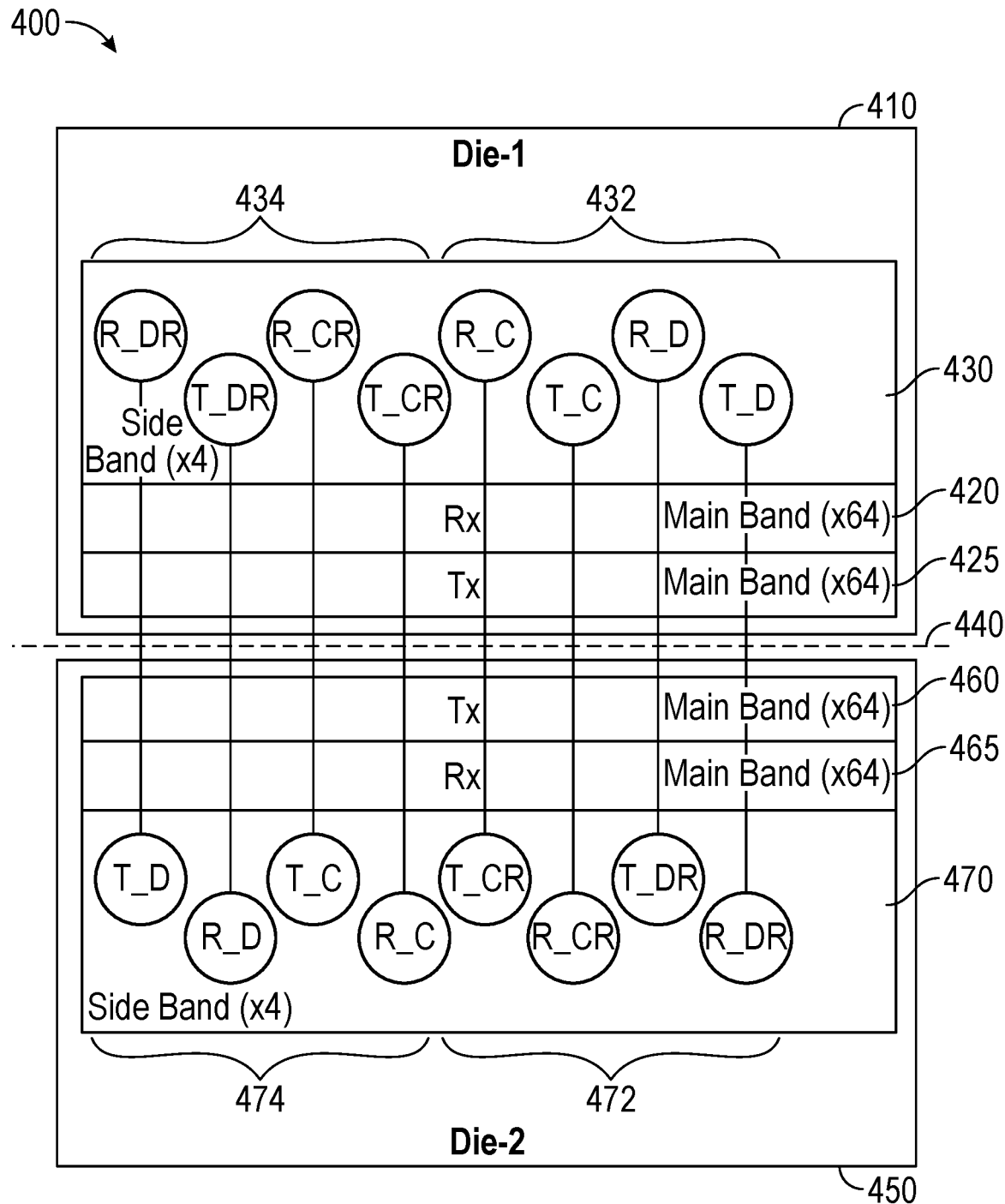

Depending upon a sideband detection that is performed during a sideband initialization, it may be determined that one or more of the sideband lanes and/or associated sideband circuitry is defective and thus at least a portion of redundant sideband circuitry can be used as part of a functional sideband. More specifically FIG. 4B shows a second possible connectivity implementation between the sideband circuitry of the two die. In this example, redundant sideband data transmitter and receiver are present in sideband circuitry 472 to act as part of the functional sideband.

In different implementations, an initialization and bring up flow may allow for any connectivity as long as data-to-data and clock-to-clock connectivity is maintained. If no redundancy is required based on such initialization, both sideband circuit pairs can be used to extend sideband bandwidth, enabling faster message exchanges. Note that while FIGS. 4A and 4B are shown in the context of an advanced package configuration, similar sideband circuitry may be present on die used in a standard package. However in certain implementations, redundant sideband circuitry and redundant sideband lanes may not be present in a standard package, as a standard package may not provide for redundancy and lane repair support.

Figure 5:
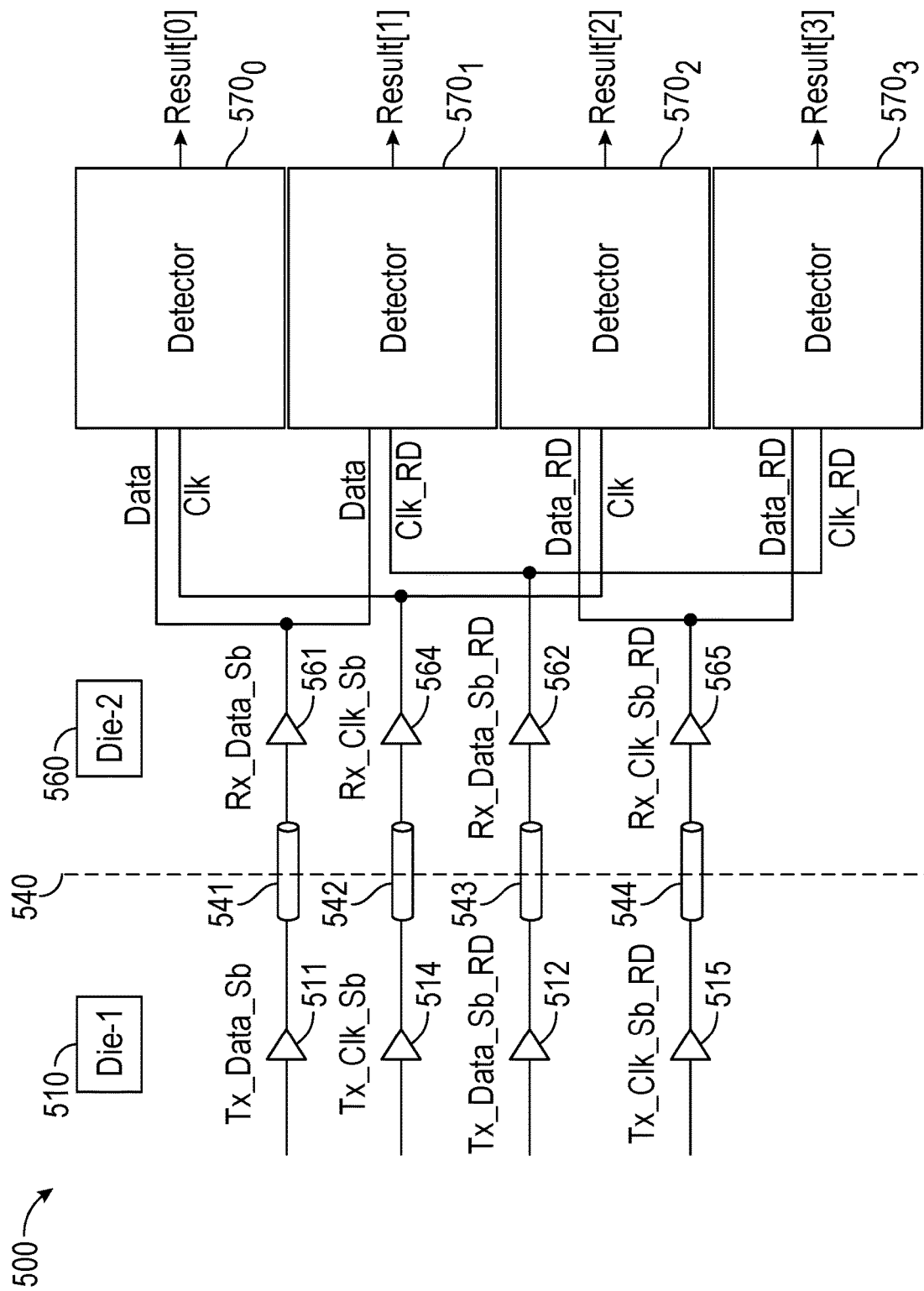
FIG. 5 is a schematic diagram illustrating a die-to-die connection in accordance with an embodiment.

Referring now to FIG. 5, shown is a schematic diagram illustrating a die-to-die connection in accordance with an embodiment. As shown in FIG. 5, a package 500 includes a first die 510 and a second die 560. An interconnect 540, e.g., a UCIe interconnect, includes a plurality of sideband lanes, namely sideband lanes 541-544. Understand while a single direction of sideband lanes is illustrated, corresponding sets of sideband lanes may also be provided for the other direction. First die 510 includes sideband data transmitters and sideband clock transmitters, namely, sideband data transmitters 511, 512 (where sideband data transmitter 512 is a redundant transmitter). First die 510 further includes sideband clock transmitters 514, 515 (where sideband clock transmitter 515 is a redundant transmitter). Second die 560 includes, in turn, sideband data receivers and sideband clock receivers, namely, sideband data receivers 561, 562 (where sideband data receiver 562 is a redundant receiver). Second die 560 further includes sideband clock receivers 564, 565 (where sideband clock receiver 565 is a redundant receiver).

Still referring to FIG. 5, detection circuitry is present in second die 560 that may be used to perform a sideband detection, which may be part of a sideband initialization to determine what lanes are to be included in a functional sideband and what lanes may be part of a redundant sideband. As illustrated, a plurality of detectors $570_{0-3}$ are provided. Each detector 570 receives an incoming sideband data signal and an incoming sideband clock signal such that each detector 570 receives the signals from different combinations of the sideband receivers of second die 560. During sideband initialization, the incoming sideband data signal may be a predetermined sideband initialization packet that includes a predetermined pattern. Detectors 570 may be configured to detect presence of this pattern and generate a first result (e.g., a logic 1) in response to valid detection of the pattern (e.g., for a number of iterations of the pattern) and generate a second result (e.g., a logic 0) in response to no detection of the predetermined pattern. Although embodiments are not limited in this regard, in one implementation detectors 570 may be configured with shift registers, counters and so forth to perform this detection operation and generate the corresponding result by sampling data and redundant data using a clock signal and a redundant clock signal, leading to four combinations.

Note that in cases where redundant sideband circuitry is not used for repair purposes, it may be used to increase bandwidth of sideband communications, particularly for data-intensive transfers. As examples, a sideband in accordance with an embodiment may be used to communicate large amounts of information to be downloaded, such as a firmware and/or fuse download. Or the sideband can be used to communicate management information, such as according to a given management protocol. Note that such communications may occur concurrently with other sideband information communications on the functional sideband.

Figure 6A:
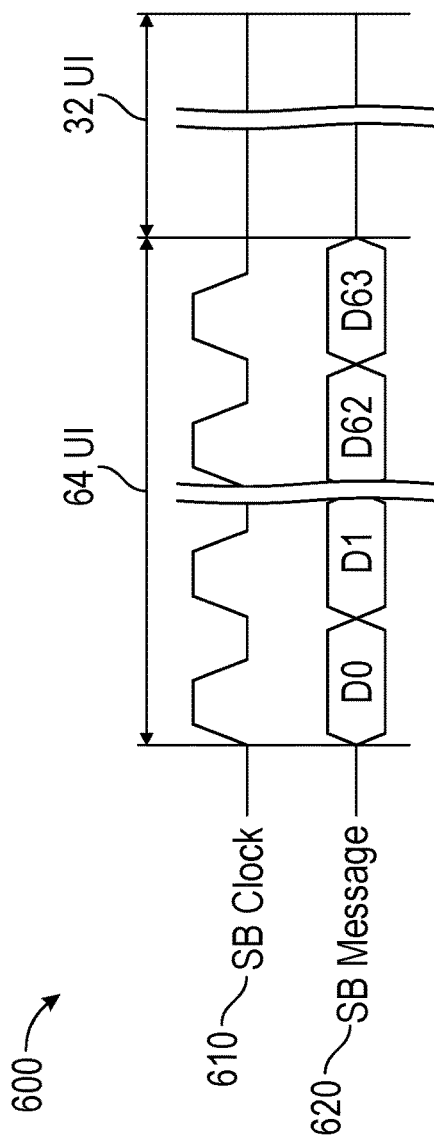
FIGS. 6A/6B are timing diagrams illustrating sideband signaling in accordance with an embodiment.

Referring now to FIG. 6A, shown is a timing diagram illustrating sideband signaling in accordance with an embodiment. As shown in FIG. 6A, timing diagram 600 includes a sideband clock signal 610 and a sideband message signal 620. Sideband message formats may be defined as a 64-bit header with 32 bits or 64 bits of data that are communicated during 64 unit intervals (UIs). Sideband message signal 620 illustrates a 64-bit serial packet. Sideband data may be sent edge aligned with the clock (strobe) signal. A receiver of a sideband interface samples the incoming data with the strobe. For example, the negative edge of the strobe can be used to sample the data as the data uses SDR signaling.

Figure 6B:
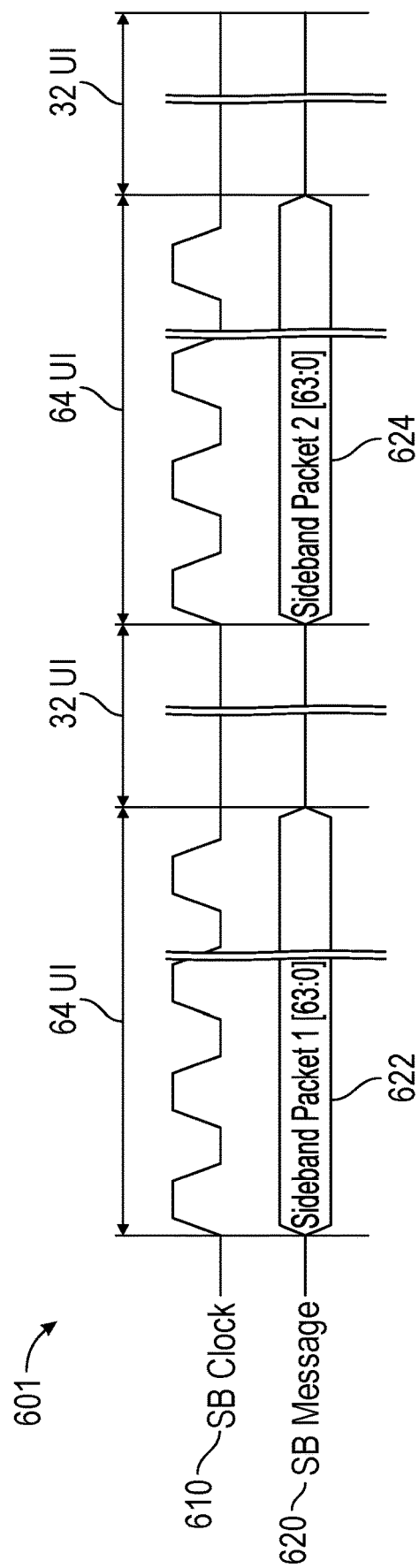

Referring now to FIG. 6B, shown is a timing diagram illustrating sideband packet back-to-back transmission in accordance with an embodiment. As shown in FIG. 6B, timing diagram 601 illustrates communication of a first sideband packet 622 followed by a second sideband packet 624. As shown, each packet may be a 64 bit serial packet that is sent during a 64 UI duration. More specifically, first sideband packet 622 is sent that in turn is followed by a 32 UI duration of logic low on both clock and data lanes, after which second sideband packet 624 is communicated. In embodiments, such signaling may be used for various sideband communications, including sideband messages during a sideband initialization.

Figure 7:
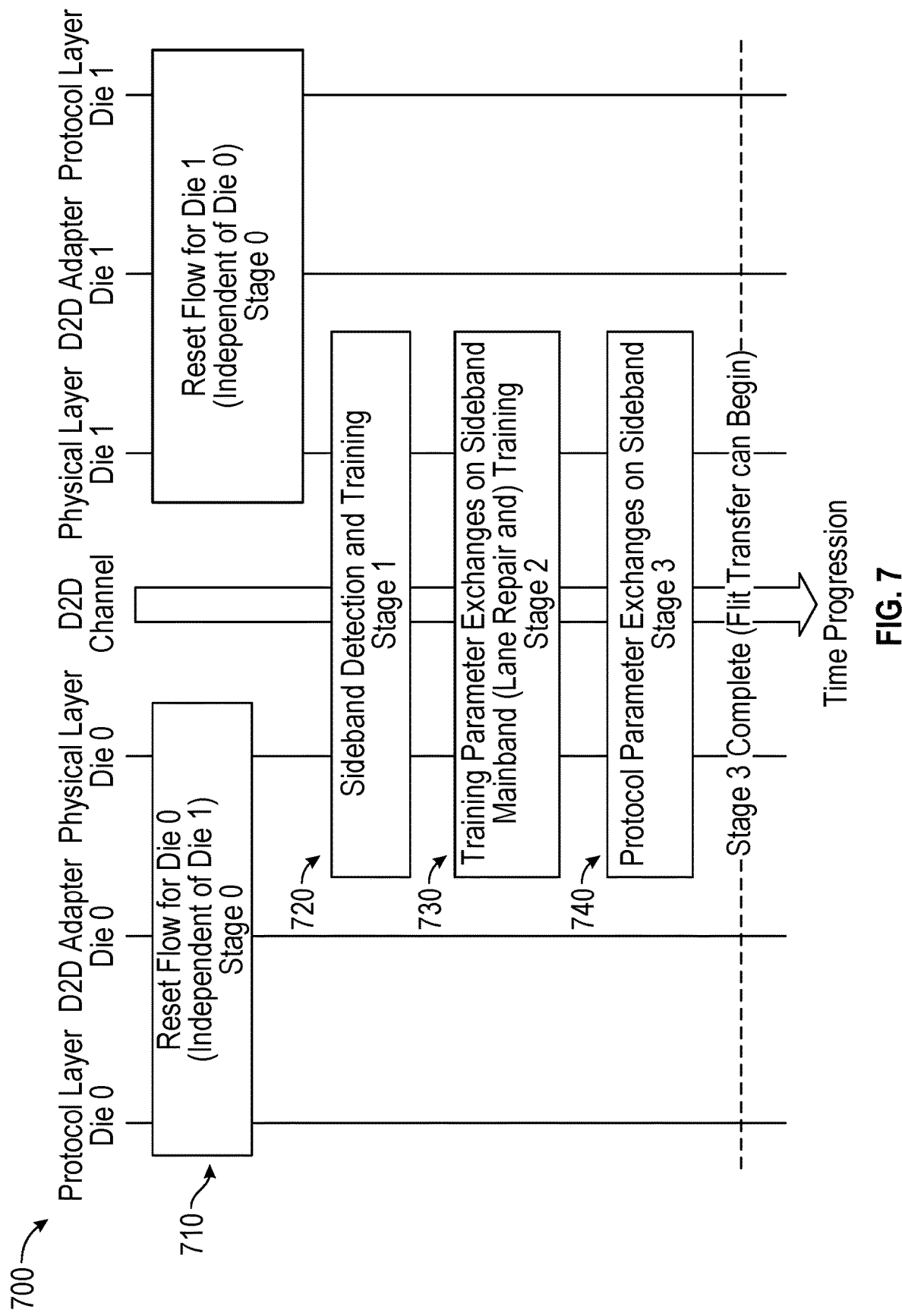
FIG. 7 is a flow diagram illustrating a bring up flow for an on-package multi-protocol capable interconnect in accordance with an embodiment.

Referring now to FIG. 7, shown is a flow diagram illustrating a bring up flow for an on-package multi-protocol capable interconnect in accordance with an embodiment. As shown in FIG. 7, a bring up flow 700 begins by independently performing reset flows on two dies (dies 0 and 1) that are coupled together via, e.g., a UCIe interconnect (illustrated in FIG. 7 as a D2D channel). Thus, a first die (die 0) performs an independent reset flow at stage 710, and a second die (die 1) also performs an independent reset flow at stage 710. Note that each die may exit its reset flow at different times. Next at stage 720 a sideband detection and training may be performed. In stage 720 the sideband may be detected and trained. In the case of an advanced package where lane redundancy is available, available lanes may be detected and used for sideband messages. Note that this sideband detection and training, which includes a sideband initialization as described herein, may be used to detect presence of activity in a coupled die, since as discussed above, each die may exit a reset flow at a different time. In one or more embodiments, a trigger for exiting out of reset and initiating link training is detection of a sideband message pattern. When training during link bring up as when a physical layer transitions out of a reset state, hardware is permitted to attempt training multiple times. During this bring up operation, synchronization may occur as every state and substrate entry and exit for both dies is ensured to be in lockstep by a 4-way sideband message handshake between the dies.

At stage 730, training parameter exchanges may be performed on the functional sideband, and a main band training occurs. In stage 730, the main band is initialized, repaired and trained. Finally at stage 740, protocol parameter exchanges may occur on the sideband. In stage 740, the overall link may be initialized by determining local die capabilities, parameter exchanges with the remote die and a bring up of a FDI that couples a corresponding protocol layer with a D2D adapter of the die. In an embodiment, the mainband, by default, initializes at the lowest allowed data rate in the mainband initialization, where repair and reversal detection are performed. The link speed then transitions to a highest common data rate that is detected through the parameter exchange. After link initialization, the physical layer may be enabled to performed protocol flit transfers via the mainband.

In one or more embodiments, different types of packets may be communicated via a sideband interface, and may include: (1) register accesses, which can be Configuration (CFG) or Memory Mapped Reads or Writes and can be 32-bit or 64-bits (b); (2) messages without data, which can be Link Management (LM), or Vendor Defined Packets, and which do not carry additional data payloads; (3) messages with data, which can be Parameter Exchange (PE), Link Training related or Vendor Defined, and carry 64b of data. Packets may carry a 5-bit opcode, 3-bit source identifier (srcid), and a 3-bit destination identifier (dstid). The 5-bit opcode indicates the packet type, as well as whether it carries 32b of data or 64b of data.

Flow control and data integrity sideband packets can be transferred across FDI, RDI or the UCIe sideband link. Each of these have independent flow control. For each transmitter associated with FDI or RDI, a design time parameter of the interface can be used to determine the number of credits advertised by the receiver, with a maximum of 32 credits. Each credit corresponds to 64 bits of header and 64 bits of potentially associated data. Thus, there is only one type of credit for all sideband packets, regardless of how much data they carry. Every transmitter/receiver pair has an independent credit loop. For example, on RDI, credits are advertised from physical layer to adapter for sideband packets transmitted from the adapter to the physical layer; and credits are also advertised from adapter to the physical layer for sideband packets transmitted from the physical layer to the adapter. The transmitter checks for available credits before sending register access requests and messages. The transmitter does not check for credits before sending register access completions, and the receiver guarantees unconditional sinking for any register access completion packets. Messages carrying requests or responses consume a credit on FDI and RDI, but they are guaranteed to make forward progress by the receiver and not be blocked behind register access requests. Both RDI and FDI give a dedicated signal for sideband credit returns across those interfaces. All receivers associated with RDI and FDI check received messages for data or control parity errors, and these errors are mapped to Uncorrectable Internal Errors (UIE) and transition the RDI to the LinkError state.

Figure 8:
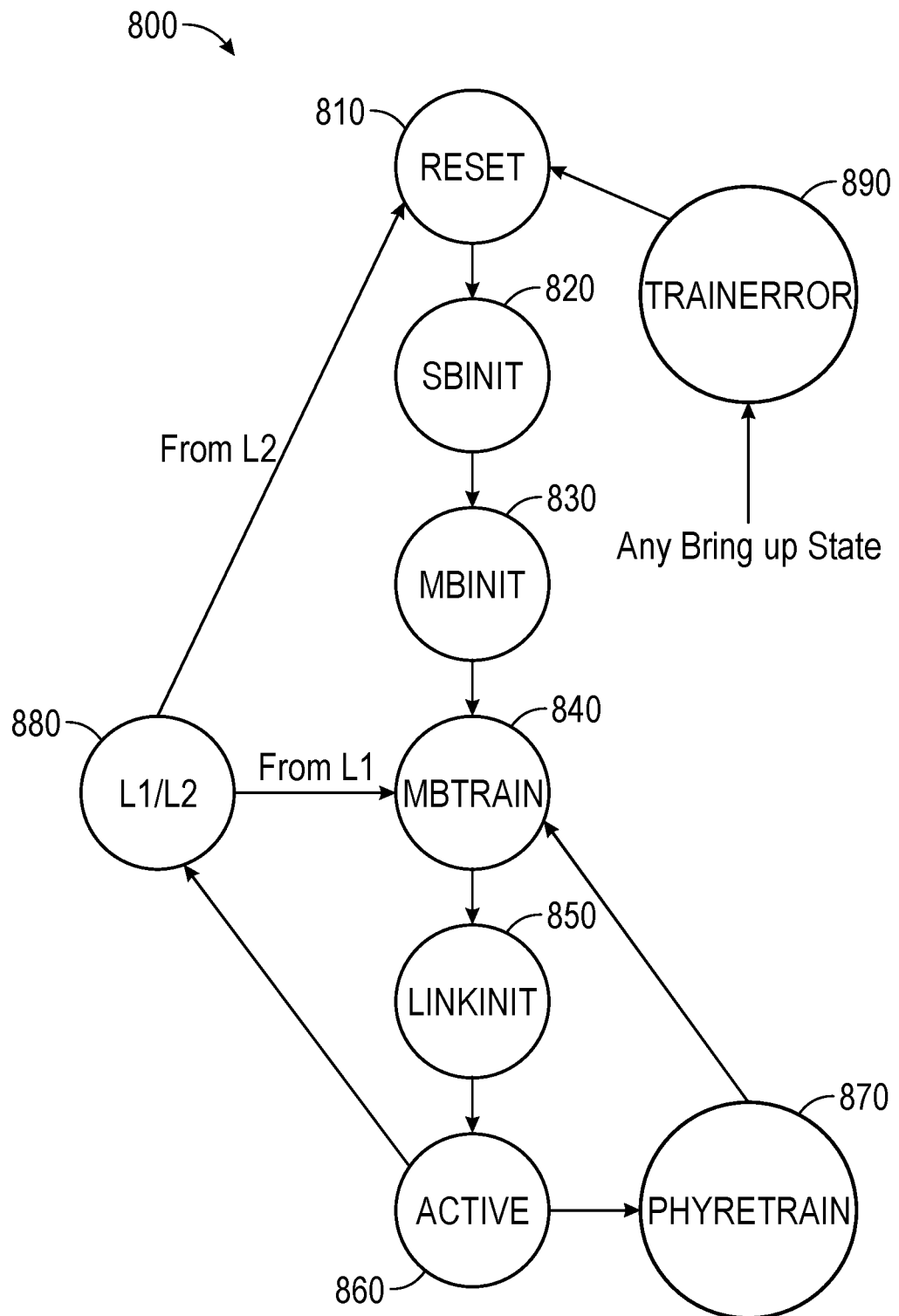
FIG. 8 is a flow diagram of a link training state machine in accordance with an embodiment.

Referring now to FIG. 8, shown is a flow diagram of a link training state machine in accordance with an embodiment. As shown in FIG. 8, method 800 is an example of a link initialization performed, e.g., by logical physical layer circuitry, which may include the link state machine. Table 1 is a high level description of the states of a link training state machine in accordance with an embodiment, and the details and actions performed in each state are described below.

TABLE 1

| STATE | DESCRIPTION |
| --- | --- |
| RESET | This is the state following primary reset or exit from TRAINERROR |
| SBINIT | Side band initialization state where the side band is detected, repaired (when applicable) and out of reset message is transmitted |
| MBINIT | Following sideband initialization, Main band (MB) is initialized at the lowest speed. Both dies perform on die calibration followed by interconnect repair (when applicable) |
| MBTRAIN | Main band (Data, Clock and Valid signals) speed of operation is set to the highest negotiated data rate. Die-to-Die training of main band is performed to center the clock with respect to Data. |
| LINKINIT | This state is used to exchange Adapter and Link management messages |
| ACTIVE | This is the state in which transactions are sent and received |
| PHYRETRAIN | This state is used to begin the retrain flow for the Link during runtime |
| TRAINERROR | State is entered when a fatal or non-fatal event occurs at any point during Link Training or operation. |

With reference to FIG. 8, method 800 begins in a reset state 810. In an embodiment, a PHY stays in the reset state for a predetermined minimum duration (e.g., 4 ms) to allow various circuitry including phase lock loops (PLLs) to stabilize. This state may be exited when power supplies are stable, a sideband clock is available and running, main band and die-to-die adapter clocks are stable and available, a main band clock is set to a slowest 10 data rate (e.g., 2 GHz for 4 GT/s), and a link training trigger has occurred. Next control passes to a sideband initialization (SBINIT) state 820, where sideband initialization may be performed. In this state, the sideband interface is initialized and repaired (when applicable). During this state, mainband transmitters may be tri-stated and mainband receivers are permitted to be disabled.

Still with reference to FIG. 8, from sideband initialization state 820, control passes to a main band initialization (MBINIT) state 830 in which a main band initialization is performed. In this state, the main band interface is initialized and repaired or degraded (when applicable). The data rate on the main band may be set to a lowest supported data rate (e.g., 4 GT/s). For an advanced package, interface interconnect repair may be performed. Sub-states in MBINIT allow detection and repair of data, clock, track and valid lanes. For a standard package interface where no lane repair is needed, sub-states are used to check functionality at a lowest data rate and perform width degrade if needed.

Next at block 840, a main band training (MBTRAIN) state 840 is entered in which main band link training may be performed. In this state, operational speed is set up and clock to data centering is performed. At higher speeds, additional calibrations like receiver clock correction, transmit and receive de-skew may be performed in sub-states to ensure link performance. Modules enter each sub-state and exit of each state is through a sideband handshake. If a particular action within a sub-state is not needed, the UCIe Module is permitted to exit it though the sideband handshake without performing the operations of that sub-state. This state may be common for advanced and standard package interfaces, in one or more embodiments.

Control then proceeds to block 850 where a link initialization (LINKINIT) state occurs in which link initialization may be performed. In this state, a die-to-die adapter completes initial link management before entering an active state on a RDI. Once the RDI is in the active state, the PHY clears its copy of a "Start UCIe link training" bit from a link control register. In embodiments, a linear feedback shift register (LFSR) is reset upon entering this state. This state may be common for advanced and standard package interfaces, in one or more embodiments.

Finally, control passes to an active state 860, where communications may occur in normal operation. More specifically, packets from upper layers can be exchanged between the two dies. In one or more embodiments, all data in this state may be scrambled using a scrambler LFSR.

Still with reference to FIG. 8, note that during active state 860 a transition may occur either to a retrain (PHYRETRAIN) state 870 or a low power (L2/L1) link state 880 may occur. As seen, depending upon the level of the low power link state, exit may proceed either to main band training state 840 or reset state 810. In the low power link states, lower power is consumed than dynamic clock gating in an ACTIVE state. This state may be entered when an RDI has transitioned to a power management state. When a local adapter requests an active on the RDI or a remote link partner requests L1 exit, the PHY exits to the MBTRAIN-.SPEEDIDLE state. In one or more embodiments, L1 exit is coordinated with the corresponding L1 state exit transitions on the RDI. When the local adapter requests the active state on RDI or the remote link partner requests L2 exit, the PHY exits to the RESET state. Note that L2 exit may be coordinated with the corresponding L2 state exit transitions on the RDI.

As further shown in FIG. 8, should an error occur during any of the bring up states, control passes to block 890 where a train error state may occur. This state is used as a transitional state due to any fatal or non-fatal events to bring the state machine back to the RESET state. If the sideband is active, a sideband handshake is performed for the link partners to enter TRAINERROR state from any state other than SBINIT.

In an embodiment, a die can enter the PHYRETRAIN state for a number of reasons. The trigger may be by an adapter-directed PHY retrain or a PHY-initiated PHY retrain. A local PHY initiates a retrain on detecting a Valid framing error. A remote die may request PHY retrain, which causes a local PHY to enter PHY retrain on receiving this request. This retrain state also may be entered if a change is detected in a Runtime Link Testing Control register during MBTRAIN.LINKSPEED state. Understand while shown at this high level in the embodiment of FIG. 8, many variations and alternatives are possible.

Figure 9:
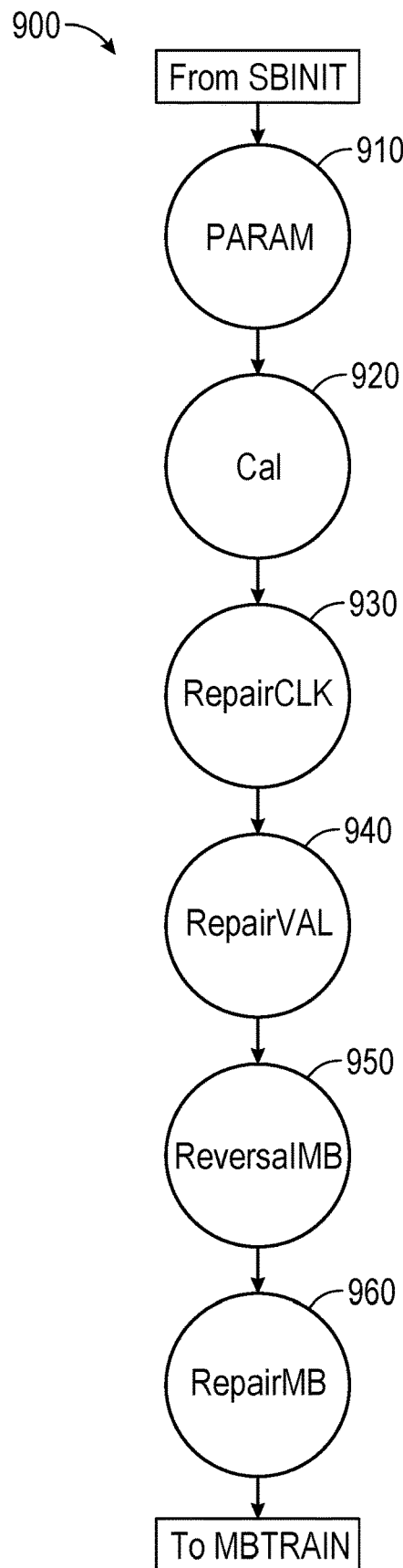
FIG. 9 is a flow diagram of further details of a main band initialization in accordance with an embodiment.

Referring now to FIG. 9, shown is a flow diagram of further details of a main band initialization in accordance with an embodiment. Method 900 may be implemented by the link state machine to perform main band initialization. As shown, this initialization proceeds through a plurality of states, including a parameter exchange state 910, a calibration state 920, a repair clock state 930, a repair validation state 940, a reversal main band state 950, and finally a main band repair state 960. After completion of this main band initialization, control proceeds to main band training.

In parameter exchange state 910, an exchange of parameters may occur to setup the maximum negotiated speed and other PHY settings. In an embodiment, the following parameters may be exchanged with a link partner (e.g., on a per Module basis): voltage swing; maximum data rate; clock mode (e.g., strobe or continuous clock); clock phase; and Module ID. In state 920, any calibration needed (e.g., transmit duty cycle correction, receiver offset and Vref calibration) may be performed.

Next at block 930, detection and repair (if needed) to clock and track Lanes for Advanced Package interface and for functional check of clock and track Lanes for Standard Package interface can occur. At block 940, A Module may set the clock phase at the center of the data UI on its mainband transmitter. The Module partner samples the received Valid with the received forwarded clock. All data lanes can be held at low during this state. This state can be used to detect and apply repair (if needed) to Valid Lane.

Still referring to FIG. 9, block 950 is entered only if clock and valid lanes are functional. In this state, data lane reversal is detected. All transmitters and receivers of a Module are enabled. The Module sets the forwarded clock phase at the center of the data UI on its mainband. The Module partner samples the incoming data with the incoming forwarded clock. A 16-bit "Per Lane ID" pattern (unscrambled) is a lane specific pattern using a Lane ID for the corresponding lane.

In an embodiment, devices also may be configured to support lane reversal within a Module. An example of lane reversal is when physical data lane 0 on a local die is connected to physical data lane (N-1) on the remote die (physical data lane 1 is connected to physical data lane N-2 and so on), e.g., where N=16 for a standard package and N=64 for an advanced package. Redundant lanes, in case of an advanced package, may also be reversed. In one or more embodiments, lane reversal is implemented on the transmitter only. The transmitter reverses the logical lane order on data and redundant data lanes. In an embodiment, lane reversal is discovered and applied during initialization and training. To enable lane reversal discovery, each logical data and redundant lane within a module is assigned a unique lane ID, namely the Per Lane ID pattern described above.

Still referring to FIG. 9, at block 960, which is entered only after lane reversal detection and application is successful, all the transmitters and receivers of a Module are enabled. The Module sets the clock phase at the center of the data UI for its mainband. The Module partner samples the incoming data with the incoming forwarded clock on its mainband receivers. In this state, the main band lanes are detected and repaired if needed for Advanced Package interface and for functional check and width degrade for Standard Package interface. Stated another way, if an error is detected in a lane, redundant circuitry can be enabled via a redundant lane.

In example embodiments, several degrade techniques may be used to enable a link to find operational settings, during bring up and operation. First a speed degrade may occur when an error is detected (during initial bring up or functional operation) and repair is not required. Such speed degrade mechanism may cause the link to go to a next lower allowed frequency; this is repeated until a stable link is established. Second a width degrade may occur if repair is not possible (in case of a standard package link where there are no repair resources), the width may be allowed to degrade to a half width configuration, as an example. For example, a 16 lane interface can be configured to operate as an 8 lane interface.

Figure 10:
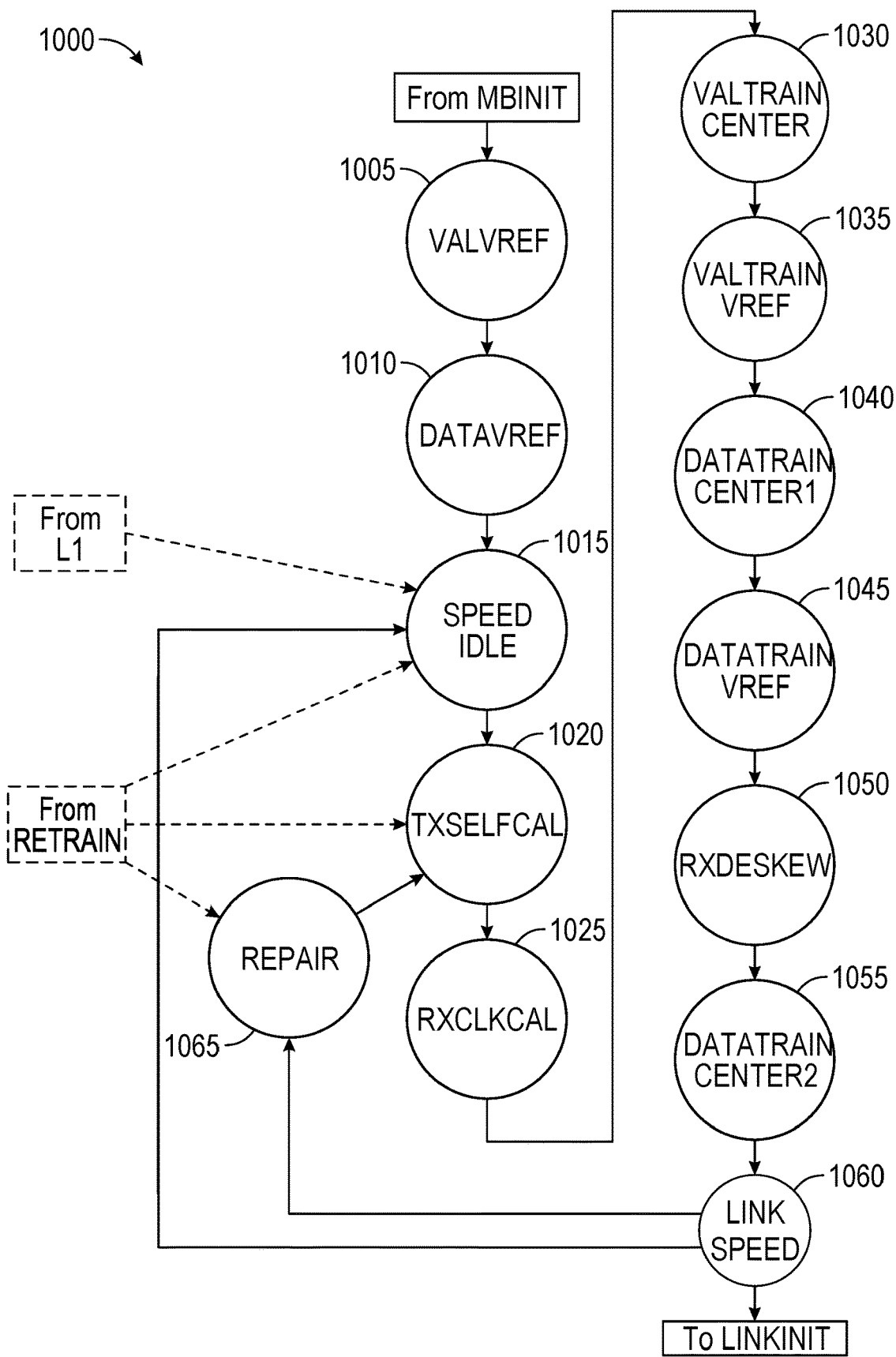
FIG. 10 is a flow diagram of a main band training in accordance with an embodiment.

Referring now to FIG. 10, shown is a flow diagram of a main band training in accordance with an embodiment. As shown in FIG. 10, method 1000 may be implemented by the link state machine to perform main band training. In main band training, the main band data rate is set to the highest common data rate for the two connected devices. Data to clock training, deskew and Vref training may be performed using multiple sub states. As shown in FIG. 10, main band training proceeds through a plurality of states or sub-states. As illustrated, main band training begins by performing valid reference voltage training state 1005. In state 1005, a receiver reference voltage (Vref) to sample the incoming Valid is optimized. The data rate on the main band continues to be at the lowest supported data rate. The Module partner sets the forwarded clock phase to the center of the data UI on its main band transmitters. The receiver Module samples the pattern on the Valid signal with the forwarded clock. All data lanes are held low during Valid lane reference voltage training. Control next proceeds to a data reference voltage state 1010, where a receiver reference voltage (Vref) to sample the incoming data is optimized, while the data rate continues to be at the lowest supported data rate (e.g., 4 GT/s). The transmitter sets the forwarded clock phase at the center of the data UI. Thereafter, an idle speed state 1015 occurs where a frequency change may be allowed in this electrical idle state; more specifically, the data rate may be set to the maximum common data rate decided in the previous state. Thereafter, circuit parameters may be updated in transmitter and receiver calibration states (1020 and 1025).

Still referring to FIG. 10, various training states 1030, 1035, 1040 and 1045 may proceed to respectively train valid-to-clock training reference voltage level, full data-to-clock training, and data receiver reference voltages. In state 1030, to ensure the valid signal is functional, valid-to-clock training is performed before data lane training. The receiver samples the pattern on valid with the forwarded clock. In state 1035, the Module may optimize the reference voltage (Vref) to sample the incoming valid at the operating data rate. In state 1040, the Module performs full data to clock training (including valid) using LFSR patterns. In state 1045, the Module may optimize the reference voltage (Vref) on its data receivers to optimize sampling of the incoming data at the operating data rate.

Still with reference to FIG. 10, thereafter a receiver deskew state 1050 may occur, which is a receiver-initiated training step for the receiver to perform lane-to-lane deskew, to improve timing margin. Next another data training state 1055 occurs in which the Module may re-center the clock to aggregate data in case the Module partner's receiver performed a per lane deskew. Control next passes to a link speed state 1060, where link stability at the operating data rate may be checked after the final sampling point is set in state 1055. If the link performance is not met at the data rate, speed is degraded to a next lower supported data rate and training is performed again. Depending upon the result of such state, main band training may conclude, with control next passing to a link initialization. Otherwise, either a link speed change at state 1015 or a repair state 1065 may occur. Note that entry into states 1015 and 1065 also may occur from a low power state (e.g., a L1 link power state) or a retraining state. Understand while shown at this high level in the embodiment of FIG. 10, many variations and alternatives are possible.

In an embodiment, a test system may be configured to perform interoperability testing and debug of different components of a semiconductor package in accordance with an embodiment. The goal of interoperability testing is to validate supported features of a Device Under Test (DUT) against a known good reference implementation. The different components of a UCIe device (e.g., physical layer, die-to-die adapter, and protocol layer) can have their own test suite for interoperability testing.

In one or more embodiments, a system setup for interoperability or debug testing may include: a reference UCIe design, which is a known good UCIe implementation; and at least one DUT that is to be tested with the reference design. Prior to being selected for interoperability testing, such DUT will have cleared testing requirements of die sort and class. In the case of an advanced package configuration, the system setup may further include a known good interposer (e.g., including a silicon bridge) to connect the different die. The above components may be integrated together in a test package.

Note as used herein, the terms "compliance" and "interoperability" are used interchangeably to refer to testing of circuity such as included in fabricated semiconductor dies to confirm compliance with requirements of a given specification, industry standard, and/or compatibility with interconnect protocol operation. In embodiments herein, such testing may be performed on a test package to ensure compliance with a UCIe specification as described herein.

Such test package may take the form shown in any one of FIGS. 2A-2D discussed above, for example. As one specific test package case with respect to FIG. 2B, die 210$_0$ may be the reference UCIe design, namely a known good die, which is then used for running interoperability testing and/or debug testing for at least one DUT, e.g., one or more of dies 210$_{1-2}$. Also in this example test package, interposer 230 may be a known good interposer. Thus in some cases, multiple DUTs may be part of a given test package to amortize packaging costs.

As discussed above, the sideband link is separate from the mainband link and it operates at relatively lower speeds and is functional for any testing/enabling. The sideband may be used to enable interoperability testing and debug modes by allowing test or debug software to access registers from different components, including physical layer or D2D adapter.

Figure 11:
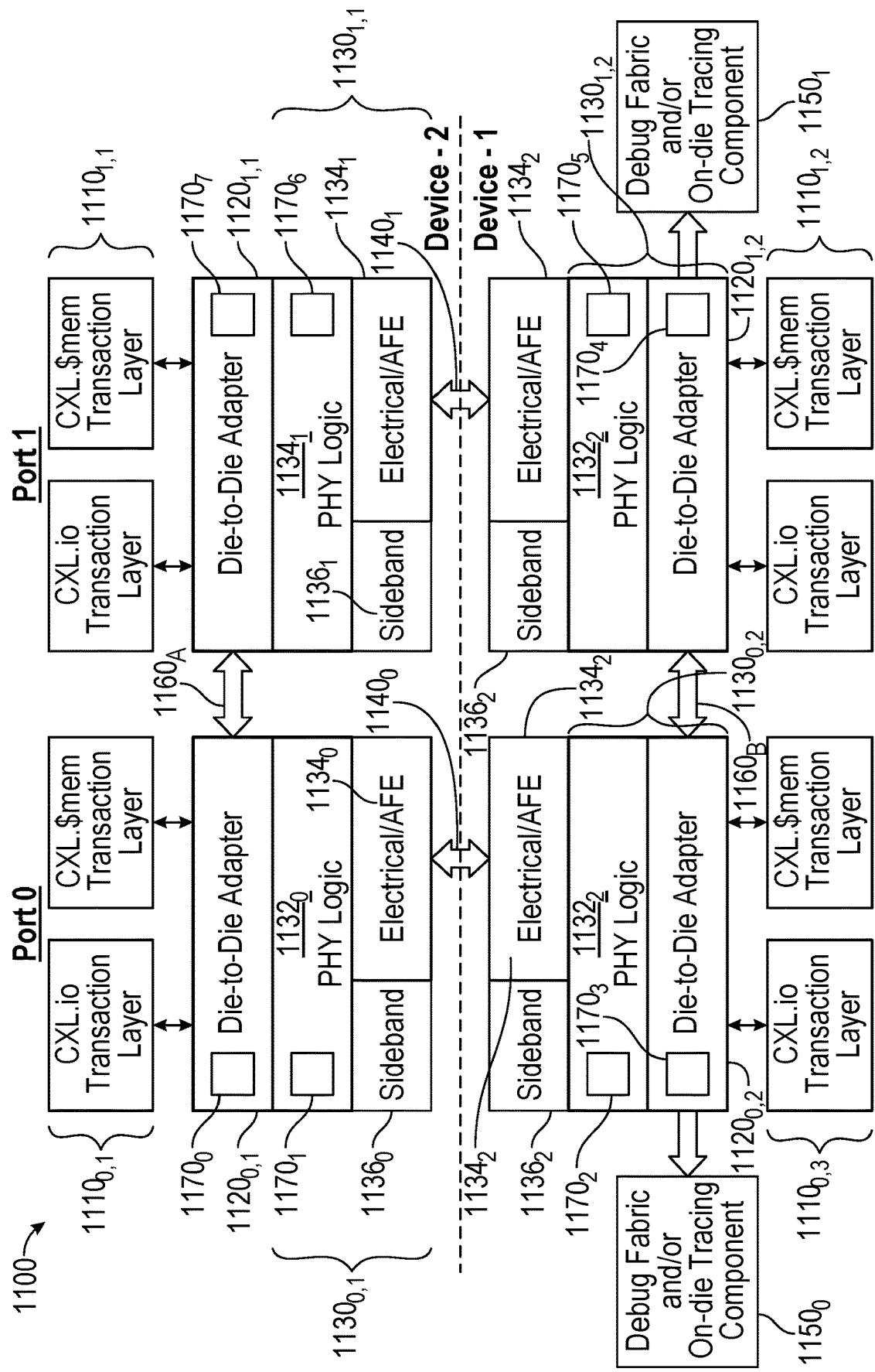
FIG. 11 is a block diagram illustrating multiple ports in communication with corresponding ports of another die in a die-to-die connection in accordance with an embodiment.

Referring now to FIG. 11, shown is a block diagram illustrating multiple ports in communication with corresponding ports of another die in a die-to-die connection. Understand while only two ports are shown, in various implementations there may be more than two ports. With embodiments herein, debug testing may occur, even when a failure occurs in one of the ports, owing to the presence of mirror port configurations.

In the high level of FIG. 11, certain circuitry of the two dies are shown. In general, stack components in FIG. 11 may be generally similarly configured the same as apparatus 300 of FIGS. 3A/3B, and thus reference numerals generally refer to the same components, albeit of the "1100" series in place of the "300" series of FIGS. 3A/3B, and such components are not further described here.

With an arrangement as in FIG. 11, a mirror port may be used to transmit data of an adjacent port in a debug mode, when a transmission issue is identified. In this regard, as shown in FIG. 11, a first mirror port $1160_A$ (of port zero) couples together D2D adapters $1120_{0,1}$-$1120_{1,1}$. Similarly, a second mirror port $1160_B$ (of port one) couples together D2D adapters $1120_{0,2}$-$1120_{1,2}$. In this way, should an error occur within port zero such as within its PHY layer 1130, debug data can be sent through D2D adapter $1120_{0,1}$ through mirror port $1160_A$ to D2D adapter $1120_{1,1}$. As such, this data can be sent out through port one circuitry to a debug fabric and/or on-die tracing component $1150_1$.

Such operation may occur in the opposite manner so that debug information from port one can be communicated out through port two circuitry to enable its receipt within debug fabric and/or on-die tracing component $1150_0$. More generally, the debug information may be sent to on-die tracing infrastructure, memory, and/or an external instrument (when applicable). Of course, while shown with this implementation in FIG. 11, variations and alternatives are possible. For example, mirror ports may instead couple between other components within the stacks of D2D adapters and PHY circuitry.

Note further in FIG. 11 that each PHY circuit 1130 and each D2D adapter 1120 may include corresponding registers $1170_{1-7}$ (generally). Registers 1170 may include configuration and status registers for various information. With embodiments herein, these status and control registers, which may include link status and control registers, can store information that may be accessed during compliance and/or debug testing.

Although embodiments, are not limited in this regard, registers 1170 may include a UCIe test/compliance register block. These registers may provide for storage of test/compliance information of a UCIe interface. Depending on the type of device, this register block may be located in different places. For example for a root port, this register block may be in a host defined static location and may include a host specific register block called CiRB; for a switch upstream port (USP), the register block may be located in a switch USP-base address region (BAR) region; for a switch downstream port (DSP), the register block may be in a CiRB; for an endpoint (EP), the register block may be included in a EP-BAR Region; and for a UCIe retimer, the register block may be located in a sideband-memory mapped IO (SB-MMIO) space. For debug and run-time link health monitoring reasons, host software can access these and other UCIe related registers in any partner die on the sideband interface. As examples, register accesses over the sideband may include UCIe related capability registers and one or more UCIe register blocks.

In an embodiment, on-die tracing component 1150 may be configured to capture real time functional traffic. The capture may be based on a mask match-based trigger. A pattern may be defined within a portion of a transmitted flit which, when detected, may cause a receive die to capture a (e.g., programmable) number of flits or specific portion of them. These captured flits may be read out later to check for any errors. Alternatively, the trigger may be a cyclic redundancy check (CRC) pattern or other design for test (DFx) hook.

In another embodiment, a mailbox mechanism may be defined to access remote die registers for debug. The mailbox register may be a virtual register space in a D2D adapter. Software may access these registers like any other local registers. However, when enabled, a portion of the mailbox address (least significant bits (LSBs) for example) may be used to map to (and read out) a remote link partner's register space, on-die storage, array freeze dump or scan data (array bits can be read out serially after stopping the clocks). This mechanism may be locked in production usages and only enabled on debug platforms.

In one or more embodiments, some capabilities and tests that may occur via sideband communications include: training progression and monitoring so that the reference design can monitor state progressions and parameters of the DUT to ensure specification compliance; adapter parameter negotiation, in which the reference design enables exercising different arcs of a flit format negotiation tree to ensure that mandatory flit formats are supported for a given protocol. Additional compliance testing for a CXL device may include leveraging coherency compliance algorithms such as may be specified in a given CXL specification. Another possible testing capability may be to implement on-die flit tracing.

In an embodiment, link status and control registers may capture link status. This may occur in conjunction with precise time stamps that provide information for link debug and compliance. Generally, a UCIe specification may define capability, control, and status registers for PHY logical and adapter elements. Based on the defined and available registers, a link state machine logger may be configured to monitor state progression, time spent in each state, and sub-state and/or stuck state (when applicable).

Example electrical testing for interoperability and/or debug may include: voltage and timing eye margin testing; low frequency receiver ViH/ViL voltage sensitivity testing; pattern generation and pattern checking; loopback (e.g., one or more of Near End Loop Back (NELB) and Far End Loop Back (FELB)); view pins (that may be shared with the rest of a SoC). Other interoperability and/or debug testing may include I/O scan and/or built-in self-test (BIST), among others.

As one example on a receiver side, low frequency voltage swing detection may include communication of a specific low frequency pattern (e.g., 64 zeros and 64 ones clock pattern), and high frequency pseudorandom binary sequence (PRBS) patterns may be defined to detect transmitter voltage swing. NELB testing may be used provide a transmit signal to a device's own receiver at a device pad, which may be used to check the device's own signal quality if issues are found in transmission to the other device. Via one or more view pins, data may be transmitted (at speed or at a lower data rate) to be captured by external instruments, which may be used to view captured or frozen data.

A test infrastructure such as shown in FIG. 11 may be enable compliance testing and/or debug to occur without directly connecting the on-package interconnect to external instrumentation like oscilloscopes, testers, protocol analyzers or so forth.

Figure 12:
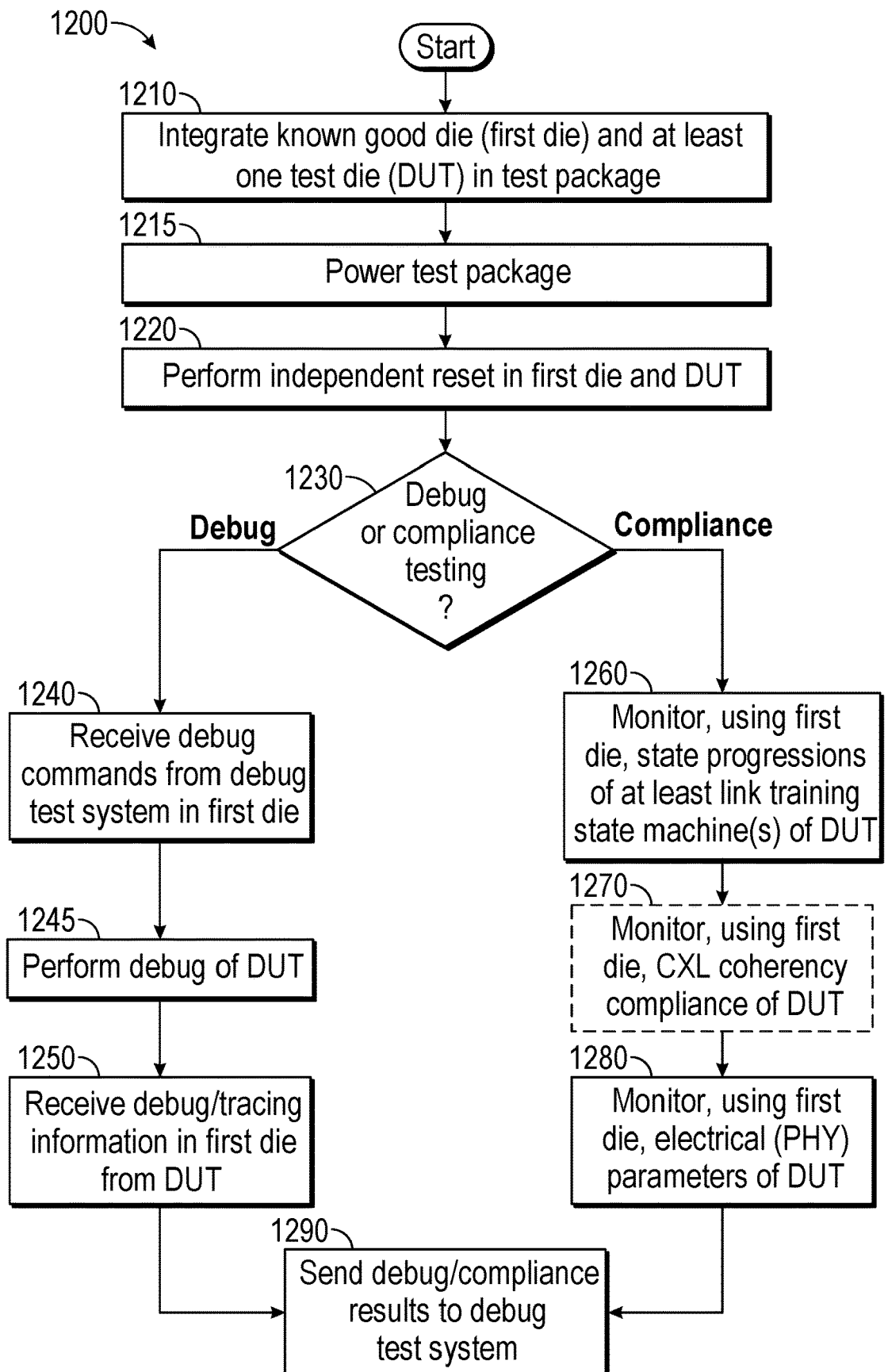
FIG. 12 is a flow diagram of a method in accordance with an embodiment.

Referring now to FIG. 12, shown is a flow diagram of a method in accordance with an embodiment. As shown in FIG. 12, method 1200 is a method for performing a testing of a semiconductor package in accordance with an embodiment. Method 1200 may be performed in a variety of test situations, such as during compliance testing of a given semiconductor die incorporated within a test package that has at least one good known die and one or more test dies in the form of devices under test. In other cases, a semiconductor package that is suffering from failure may undergo some type of debug testing in a lab environment.

In any event, method 1200 begins by integrating at least two dies within a test package (block 1210). In the context of a compliance test, the first die that is a known good die acts as a UCIe reference design (where this reference design may be a SoC or other processor having at least one core and an UCIe protocol stack). In a compliance testing implementation, the second die that is the device under test may be a die that has been manufactured and successfully tested for class and wafer sort, and may be of a semiconductor manufacturer seeking compliance for this die. In this case, block 1210 may be performed by a compliance agent. In other cases, block 1210 may be performed during normal assembly operations of a semiconductor package including multiple dies as may be the case, e.g., for debug testing.

Still with reference to FIG. 12, control passes from block 1210 to block 1215 where the test package may be powered up. In some cases, a test bench may have a circuit board onto which the test package is adapted. In other cases, the test package may be incorporated into a larger device under test, such as any type of computing system. Next at block 1220, after being powered up, the dies within the test package may undergo independent reset operations, as discussed above.

Still referring to FIG. 12, next at diamond 1230, it is determined whether the debug or compliance testing is to be performed. In the case of debug testing, control passes to block 1240 where debug commands may be received from a debug test system. More specifically, such debug commands may be received within the first die to indicate to the first die that debug is being performed and to indicate the desired type of debug testing. Next at block 1245, debug of the device under test may be performed. Depending upon where a failure is expected within the device under test, such debug testing may occur during link initialization to obtain information present in registers of, e.g., die-to-die adapters or physical layer circuitry. In other cases, debug information may be obtained from a register block that stores UCIe or other interconnect-related information. Next at block 1250, this debug/tracing information may be received in the first die from the device under test. This information may be received via a sideband of the interconnect that couples the dies together. Finally, control passes to block 1290 where the debug results information may be sent to the debug test system where it may be analyzed.

Still with reference to FIG. 12, instead if compliance testing is desired, control passes from diamond 1230 to block 1260 where progression of at least one link training state machine of the device under test may be monitored. More specifically, via a sideband of the interconnect, the first die may access information present in link status and control registers and/or a UCIe test/compliance register block. Optionally, at block 1270, certain coherence compliance testing, e.g., of a CXL protocol, also may be monitored. As part of the compliance testing, at block 1280, electrical (PHY) parameters of the device under test also may be accessed. In some cases all of the compliance testing information may be received in the first die via the sideband of the interconnect that couples the dies together. Then as shown, control passes to block 1290 where the information may be provided to the debug test system, e.g., for compliance testing determination. Understand while shown at this high level in the embodiment of FIG. 12, many variations and alternatives are possible.

Embodiments may support two broad usage models. The first is package level integration to deliver power-efficient and cost-effective performance. Components attached at the board level such as memory, accelerators, networking devices, modem, etc. can be integrated at the package level with applicability from hand-held to high-end servers. In such use cases dies from potentially multiple sources may be connected through different packaging options, even on the same package.

The second usage is to provide off-package connectivity using different type of media (e.g., optical, electrical cable, millimeter wave) using UCIe retimers to transport the underlying protocols (e.g., PCIe, CXL) at the rack or pod level for enabling resource pooling, resource sharing, and/or message passing using load-store semantics beyond the node level to the rack/pod level to derive better power-efficient and cost-effective performance at the edge and data centers.

Figure 13:
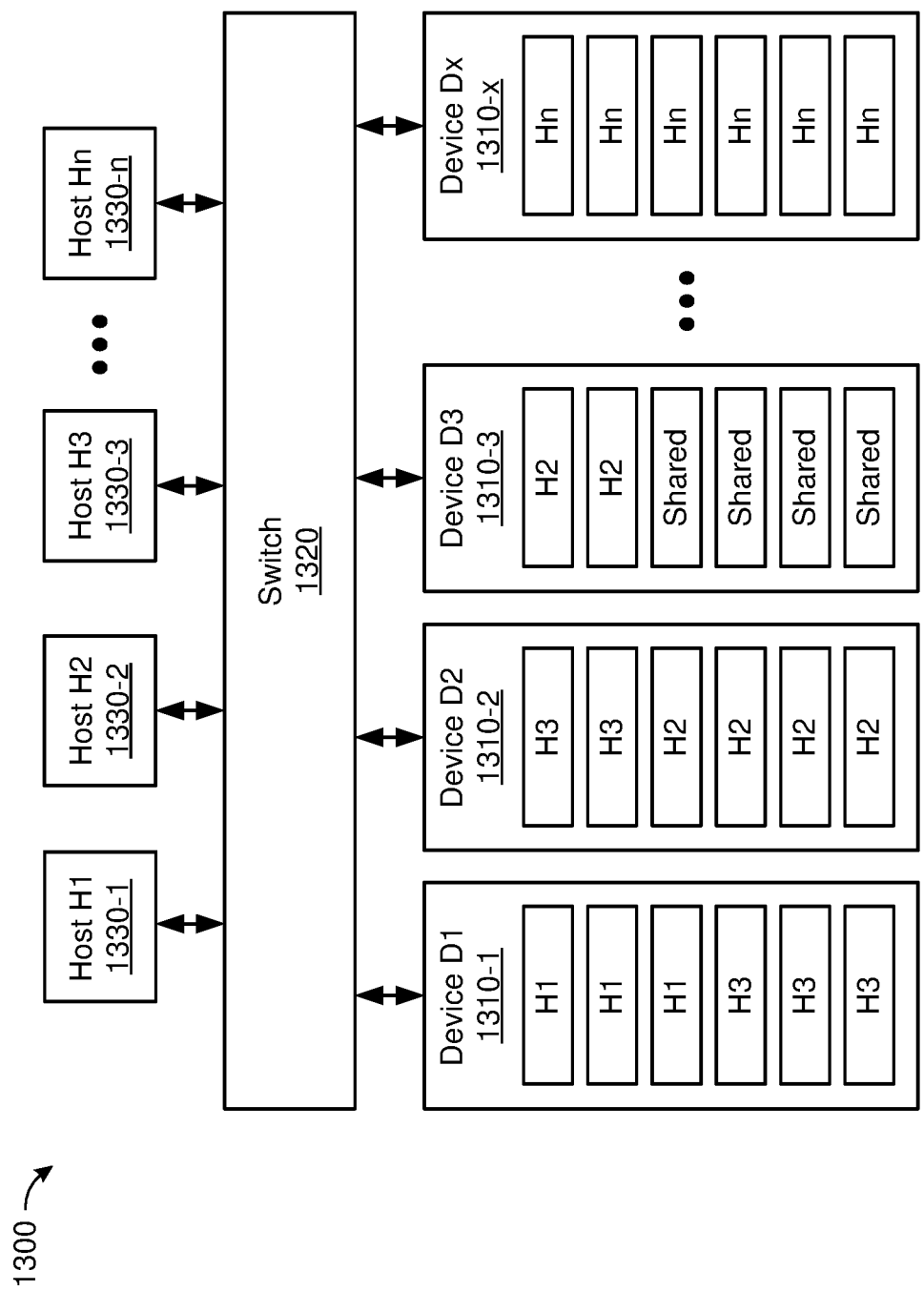
FIG. 13 is a block diagram of another example system in accordance with an embodiment.

As discussed above, embodiments may be implemented in datacenter use cases, such as in connection with racks or pods. As an example, multiple compute nodes from different compute chassis may connect to a CXL switch. In turn, the CXL switch may connect to multiple CXL accelerators/Type-3 memory devices, which can be placed in one or more separate drawers Referring now to FIG. 13, shown is a block diagram of another example system in accordance with an embodiment. In FIG. 13, system 1300 may be all or part of a rack-based server having multiple hosts in the form of compute drawers that may couple to pooled memory via one or more switches.

As shown, multiple hosts 1330-1-$n$ (also referred to herein as "hosts 1330") are present. Each host may be implemented as a compute drawer having one or more SoCs, memory, storage, interface circuitry and so forth. In one or more embodiments, each host 1330 may include one or more virtual hierarchies corresponding to different cache coherence domains. Hosts 1330 may couple to a switch 1320, which may be implemented as a UCIe or CXL switch (e.g., a CXL 2.0 (or later) switch). In an embodiment, each host 1330 may couple to switch 1320 using an off-package interconnect, e.g., a UCIe interconnect running a CXL protocol through at least one UCIe retimer (which may be present in one or both of hosts 1330 and switch 1320).

Switch 1320 may couple to multiple devices 1310-1-$x$ (also referred to herein as "device 1310"), each of which may be a memory device (e.g., a Type 3 CXL memory expansion device) and/or an accelerator. In the illustration of FIG. 13, each device 1310 is shown as Type 3 memory device having any number of memory regions (e.g., defined partitions, memory ranges, etc.). Depending on configuration and use case, certain devices 1310 may include memory regions assigned to particular hosts while others may include at least some memory regions designated as shared memory. Although embodiments are not limited in this regard, the memory included in devices 1310 may be implemented with any type(s) of computer memory (e.g., dynamic random-access memory (DRAM), static random-access memory (SRAM), non-volatile memory (NVM), a combination of DRAM and NVM, etc.).

Figure 14:
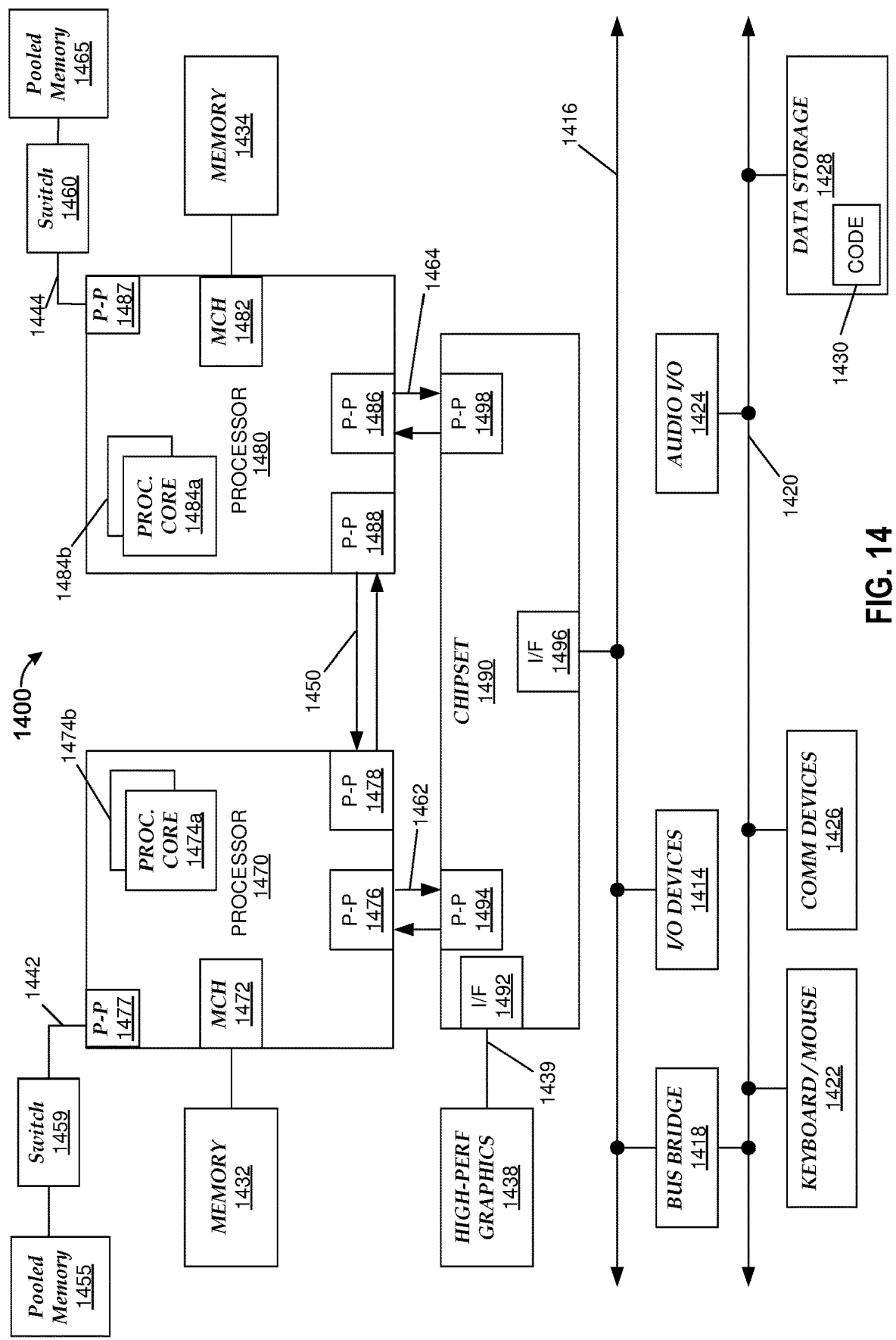
FIG. 14 is a block diagram of a system in accordance with another embodiment such as an edge platform.

Referring now to FIG. 14, shown is a block diagram of a system in accordance with another embodiment such as an edge platform. As shown in FIG. 14, multiprocessor system 1400 includes a first processor 1470 and a second processor 1480 coupled via an interconnect 1450, which can be a UCIe interconnect in accordance with an embodiment running a coherency protocol. As shown in FIG. 14, each of processors 1470 and 1480 may be many core processors including representative first and second processor cores (i.e., processor cores 1474a and 1474b and processor cores 1484a and 1484b).

In the embodiment of FIG. 14, processors 1470 and 1480 further include point-to point interconnects 1477 and 1487, which couple via interconnects 1442 and 1444 (which may be UCIe links in accordance with an embodiment) to switches 1459 and 1460. In turn, switches 1459, 1460 couple to pooled memories 1455 and 1465 (e.g., via UCIe links).

Still referring to FIG. 14, first processor 1470 further includes a memory controller hub (MCH) 1472 and point-to-point (P-P) interfaces 1476 and 1478. Similarly, second processor 1480 includes a MCH 1482 and P-P interfaces 1486 and 1488. As shown in FIG. 14, MCH's 1472 and 1482 couple the processors to respective memories, namely a memory 1432 and a memory 1434, which may be portions of system memory (e.g., DRAM) locally attached to the respective processors. First processor 1470 and second processor 1480 may be coupled to a chipset 1490 via P-P interconnects 1476 and 1486, respectively. As shown in FIG. 14, chipset 1490 includes P-P interfaces 1494 and 1498.

Furthermore, chipset 1490 includes an interface 1492 to couple chipset 1490 with a high performance graphics engine 1438, by a P-P interconnect 1439. As shown in FIG. 14, various input/output (I/O) devices 1414 may be coupled to first bus 1416, along with a bus bridge 1418 which couples first bus 1416 to a second bus 1420. Various devices may be coupled to second bus 1420 including, for example, a keyboard/mouse 1422, communication devices 1426 and a data storage unit 1428 such as a disk drive or other mass storage device which may include code 1430, in one embodiment. Further, an audio I/O 1424 may be coupled to second bus 1420.

Figure 15:
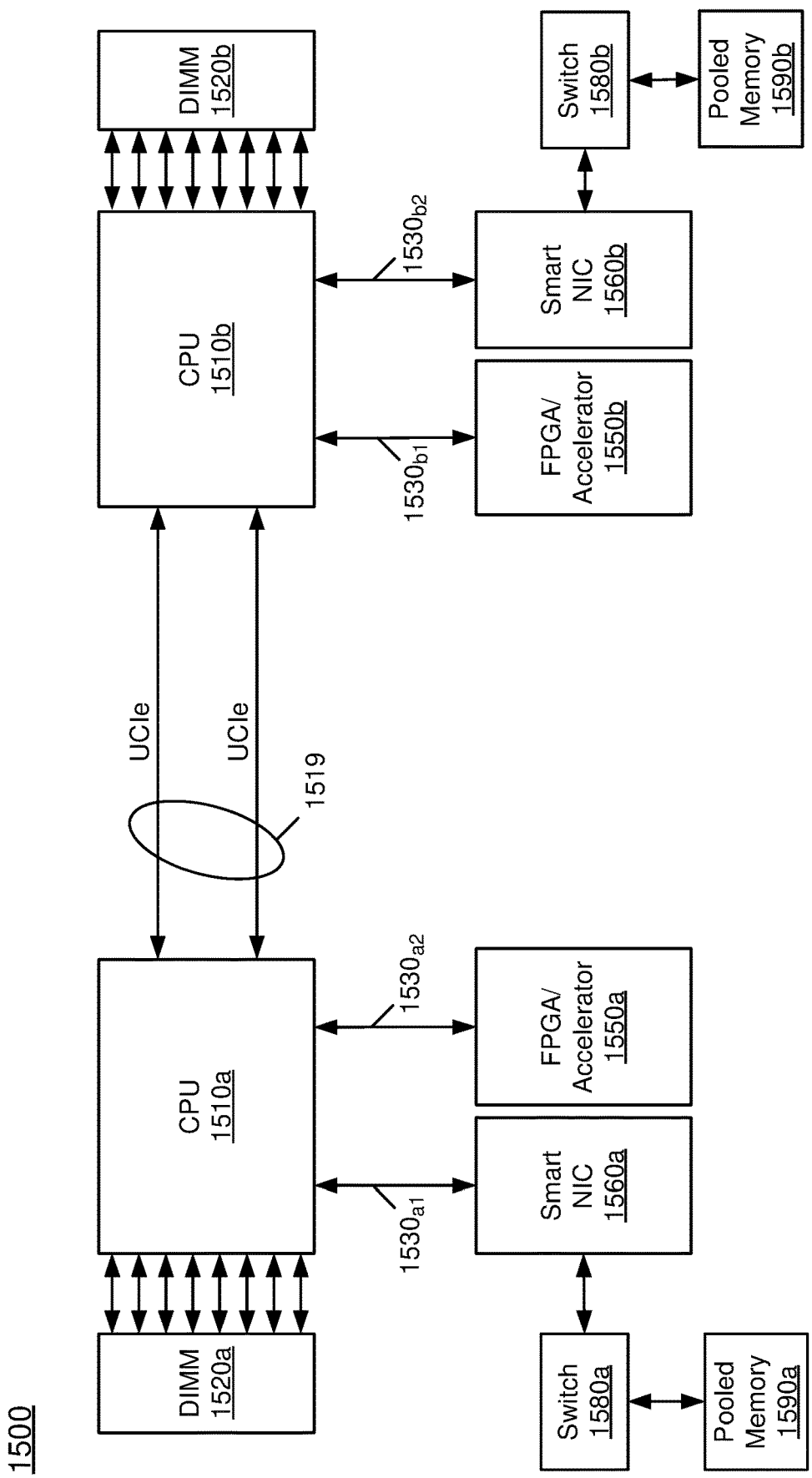
FIG. 15 is a block diagram of a system in accordance with another embodiment.

Referring now to FIG. 15, shown is a block diagram of a system 1500 in accordance with another embodiment. As shown in FIG. 15, system 1500 may be any type of computing device, and in one embodiment may be a server system. In the embodiment of FIG. 15, system 1500 includes multiple CPUs 1510a,b that in turn couple to respective system memories 1520a,b which in embodiments may be implemented as DIMMs such as double data rate (DDR) memory, persistent or other types of memory. Note that CPUs 1510 may couple together via an interconnect system 1519 such as an UCIe or other interconnect implementing a coherency protocol.

To enable coherent accelerator devices and/or smart adapter devices to couple to CPUs 1510 by way of potentially multiple communication protocols, a plurality of interconnects $1530_{a1-b2}$ may be present. Each interconnect 1530 may be a given instance of a UCIe link in accordance with an embodiment.

In the embodiment shown, respective CPUs 1510 couple to corresponding field programmable gate arrays (FPGAs)/accelerator devices 1550a,b (which may include GPUs, in one embodiment). In addition CPUs 1510 also couple to smart NIC devices 1560a,b. In turn, smart NIC devices 1560a,b couple to switches 1580a,b (e.g., CXL switches in accordance with an embodiment) that in turn couple to a pooled memory 1590a,b such as a persistent memory. In embodiments, various components shown in FIG. 15 may implement circuitry to perform techniques as described herein.

The following examples pertain to further embodiments.

In one example, an apparatus comprises a first die including: a die-to-die adapter comprising a plurality of first registers, the die-to-die adapter to communicate with protocol layer circuitry via a FDI and physical layer circuitry via a RDI, where the die-to-die adapter is to receive message information, the message information comprising first information of a first interconnect protocol; and the physical layer circuitry coupled to the die-to-die adapter, the physical layer circuity comprising a plurality of second registers, where the physical layer circuitry is to receive and output the first information to a second die via an interconnect having a mainband and a sideband, where the physical layer is to reverse a logical lane order of at least some of a plurality of data lanes of the mainband when a lane reversal with respect to the first die and the second die is detected, and during a test of the apparatus, the sideband is to enable access to information in at least one of the plurality of first registers or at least one of the plurality of second registers.

In an example, the test comprises a compliance test and during the compliance test, the sideband is to send testing information comprising at least one of eye margin testing or voltage sensitivity testing.

In an example, the test comprises a compliance test and during the compliance test, the sideband is to send training information comprising training of the second die, where the training comprises link training state machine training.

In an example, the plurality of first registers comprises link status and control registers.

In an example, the first die comprises a reference die that is a known good die and the second die comprises a device under test, the apparatus comprising a test package having the first die and the second die.

In an example, the test package further comprises a third die comprising another device under test.

In an example, the test package further comprises: a known good interposer, the first die and the second die adapted to the known good interposer; and a substrate to which the known good interposer is adapted.

In an example, the first die comprises: a first port comprising the die-to-die adapter and the physical layer circuitry; a second port comprising a second die-to-die adapter and a second physical layer circuitry; and a mirror port coupled between the first port and the second port.

In an example, in response to a failure in the first port, the mirror port is to communicate debug information of the first port to a destination via the second port.

In an example, the interconnect comprises a multi-protocol capable interconnect having a UCIe architecture, the first interconnect protocol comprising a flit mode of a PCIe protocol and the interconnect further to communicate second information of a second interconnect protocol, the second interconnect protocol comprising a flit mode of a CXL protocol.

In another example, a method comprises: performing a first reset of a first die of a test package and a second reset of a second die of the test package, the first die comprising a reference die that is a known good die and the second die comprising a device under test; after performing the first reset and the second reset, training a sideband of an interconnect that couples the first die and the second die, the interconnect comprising a mainband and the sideband; and monitoring, using the first die, a progression of at least one link training state machine of the second die as part of a testing of the second die.

In an example, the method further comprises: accessing during the testing, via the sideband, one or more registers of a die-to-die adapter of the second die; and accessing during the testing, via the sideband, one or more registers of physical layer circuitry of the second die.

In an example, the method further comprises accessing the one or more registers of at least one of the die-to-die adapter and the physical layer circuitry via a mirror port coupled between a first port and a second port of the second die, the first port comprising the die-to-die adapter and the physical layer circuitry and the second port comprising a second die-to-die adapter and second physical layer circuitry.

In an example, monitoring the progression of the at least one link training state machine of the second die comprises: monitoring a plurality of state progressions of the at least one link training state machine; and identifying an amount of time spent in each of a plurality of states of the at least one link training state machine.

In an example, the method further comprises exercising a plurality of arcs of a flit format negotiation tree as part of the testing, the testing comprising compliance testing.

In an example, the method further comprising testing one or more of eye margin, voltage sensitivity, or pattern checking as part of the testing, the testing comprising compliance testing.

In another example, a computer readable medium including instructions is to perform the method of any of the above examples.

In a further example, a computer readable medium including data is to be used by at least one machine to fabricate at least one integrated circuit to perform the method of any one of the above examples.

In a still further example, an apparatus comprises means for performing the method of any one of the above examples.

In another example, a package comprises a first die comprising a CPU and a protocol stack, and a second die coupled to the first die via an interconnect, where the first die comprises a known good die and the second die comprises a device under test. The first die may include: a die-to-die adapter comprising a plurality of first registers, the die-to-die adapter to communicate with a protocol layer via a FDI and physical layer circuitry via a RDI, where the die-to-die adapter is to communicate message information, the message information comprising first information of a first interconnect protocol; and the physical layer circuitry coupled to the die-to-die adapter via the RDI, the physical layer circuity comprising a plurality of second registers, where the physical layer circuitry is to receive and output the first information to a second die via an interconnect having a mainband and a sideband, where the physical layer circuitry is to perform a link initialization of the interconnect and the sideband is to enable access to information in at least one of the plurality of first registers or at least one of the plurality of second registers to monitor a progression of at least one link training state machine of the second die as part of a testing of the second die.

In an example, the package comprises a test package, the test package further comprising: a third die comprising another device under test; a known good interposer, at least two of the first die, the second die, or the third die adapted to the known good interposer; and a substrate to which the known good interposer is adapted.

In an example, the first die comprises: a first port comprising the die-to-die adapter and the physical layer circuitry; a second port comprising a second die-to-die adapter and a second physical layer circuitry; and a mirror port coupled between the first port and the second port, where in response to a failure in the first port, the mirror port is to communicate debug information of the first port to a destination via the second port.

In an example, the second die comprises an accelerator, where the first die is to communicate with the second die according to at least one of a flit mode of a PCIe protocol or a flit mode of a CXL protocol.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SOC or other processor, is to configure the SOC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:
1. An apparatus comprising:
a first die comprising:
a die-to-die adapter comprising a plurality of first registers, the die-to-die adapter to communicate with protocol layer circuitry via a flit-aware die-to-die interface (FDI) and physical layer circuitry via a raw die-to-die interface (RDI), wherein the die-to-die adapter is to receive message information, the message information comprising first information of a first interconnect protocol; and the physical layer circuitry coupled to the die-to-die adapter, the physical layer circuity comprising a plurality of second registers, wherein the physical layer circuitry is to receive and output the first information to a second die via an interconnect having a mainband and a sideband, wherein the physical layer circuitry is to reverse a logical lane order of at least some of a plurality of data lanes of the mainband when a lane reversal with respect to the first die and the second die is detected, wherein during a test of the apparatus, the sideband is to enable access to information in at least one of the plurality of first registers or at least one of the plurality of second registers.

2. The apparatus of claim 1, wherein the test comprises a compliance test and during the compliance test, the sideband is to send testing information comprising at least one of eye margin testing or voltage sensitivity testing.

3. The apparatus of claim 1, wherein the test comprises a compliance test and during the compliance test, the sideband is to send training information comprising training of the second die, wherein the training comprises link training state machine training.

4. The apparatus of claim 3, wherein the plurality of first registers comprises link status and control registers.

5. The apparatus of claim 1, wherein the first die comprises a reference die that is a known good die and the second die comprises a device under test, the apparatus comprising a test package having the first die and the second die.

6. The apparatus of claim 5, wherein the test package further comprises a third die comprising another device under test.

7. The apparatus of claim 5, wherein the test package further comprises:
a known good interposer, the first die and the second die adapted to the known good interposer; and
a substrate to which the known good interposer is adapted.

8. The apparatus of claim 1, wherein the first die comprises:
a first port comprising the die-to-die adapter and the physical layer circuitry;
a second port comprising a second die-to-die adapter and second physical layer circuitry; and
a mirror port coupled between the first port and the second port.

9. The apparatus of claim 8, wherein in response to a failure in the first port, the mirror port is to communicate debug information of the first port to a destination via the second port.

10. The apparatus of claim 1, wherein the interconnect comprises a multi-protocol capable interconnect having a Universal Chiplet Interconnect express (UCIe) architecture, the first interconnect protocol comprising a flit mode of a Peripheral Component Interconnect express (PCIe) protocol and the interconnect further to communicate second information of a second interconnect protocol, the second interconnect protocol comprising a flit mode of a Compute Express Link (CXL) protocol.

11. A method comprising:
performing a first reset of a first die of a test package and a second reset of a second die of the test package, the first die comprising a reference die that is a known good die and the second die comprising a device under test;
after performing the first reset and the second reset, training a sideband of an interconnect that couples the first die and the second die, the interconnect comprising a mainband and the sideband; and
monitoring, using the first die, a progression of at least one link training state machine of the second die as part of a testing of the second die.

12. The method of claim 11, further comprising:
accessing during the testing, via the sideband, one or more registers of a die-to-die adapter of the second die; and
accessing during the testing, via the sideband, one or more registers of physical layer circuitry of the second die.

13. The method of claim 12, further comprising accessing the one or more registers of at least one of the die-to-die adapter and the physical layer circuitry via a mirror port coupled between a first port and a second port of the second die, the first port comprising the die-to-die adapter and the physical layer circuitry and the second port comprising a second die-to-die adapter and second physical layer circuitry.

14. The method of claim 11, wherein monitoring the progression of the at least one link training state machine of the second die comprises:
monitoring a plurality of state progressions of the at least one link training state machine; and
identifying an amount of time spent in each of a plurality of states of the at least one link training state machine.

15. The method of claim 11, further comprising exercising a plurality of arcs of a flit format negotiation tree as part of the testing, the testing comprising compliance testing.

16. The method of claim 11, further comprising testing one or more of eye margin, voltage sensitivity, or pattern checking as part of the testing, the testing comprising compliance testing.

17. A package comprising:
a first die comprising a central processing unit (CPU) and a protocol stack comprising:
a die-to-die adapter comprising a plurality of first registers, the die-to-die adapter to communicate with protocol layer circuitry via a flit-aware die-to-die interface (FDI) and physical layer circuitry via a raw die-to-die interface (RDI), wherein the die-to-die adapter is to communicate message information, the message information comprising first information of a first interconnect protocol; and
the physical layer circuitry coupled to the die-to-die adapter via the RDI, the physical layer circuity comprising a plurality of second registers, wherein the physical layer circuitry is to receive and output the first information to a second die via an interconnect having a mainband and a sideband,
wherein the physical layer circuitry is to perform a link initialization of the interconnect and the sideband is to enable access to information in at least one of the plurality of first registers or at least one of the plurality of second registers to monitor a progression of at least one link training state machine of the second die as part of a testing of the second die; and
the second die coupled to the first die via the interconnect, wherein the first die comprises a known good die and the second die comprises a device under test.

18. The package of claim 17, wherein the package comprises a test package, the test package further comprising:
- a third die comprising another device under test;
- a known good interposer, at least two of the first die, the second die, or the third die adapted to the known good interposer; and
- a substrate to which the known good interposer is adapted.

19. The package of claim 17, wherein the first die comprises:
- a first port comprising the die-to-die adapter and the physical layer circuitry;
- a second port comprising a second die-to-die adapter and second physical layer circuitry; and
- a mirror port coupled between the first port and the second port, wherein in response to a failure in the first port, the mirror port is to communicate debug information of the first port to a destination via the second port.

20. The package of claim 17, wherein the second die comprises an accelerator, wherein the first die is to communicate with the second die according to at least one of a flit mode of a Peripheral Component Interconnect express (PCIe) protocol or a flit mode of a Compute Express Link (CXL) protocol.

* * * * *